(12) United States Patent
Latham et al.

(10) Patent No.: US 10,651,147 B2
(45) Date of Patent: May 12, 2020

(54) SIGNAL ISOLATOR HAVING BIDIRECTIONAL COMMUNICATION BETWEEN DIE

(71) Applicant: Allegro MicroSystems, LLC, Manchester, NH (US)

(72) Inventors: Alexander Latham, Harvard, MA (US); Joseph James Judkins, III, Bedford, MA (US); Neil Tan, Shrewsbury, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/702,937

(22) Filed: Sep. 13, 2017

(65) Prior Publication Data

US 2018/0076176 A1  Mar. 15, 2018

Related U.S. Application Data

(60) Provisional application No. 62/393,805, filed on Sep. 13, 2016.

(51) Int. Cl.
| | |
|---|---|
| *H04B 5/00* | (2006.01) |
| *H01L 43/02* | (2006.01) |
| *H04B 17/29* | (2015.01) |
| *H01L 25/065* | (2006.01) |
| *H04B 5/02* | (2006.01) |
| *H04B 17/17* | (2015.01) |
| *H04B 17/18* | (2015.01) |

(52) U.S. Cl.
CPC .......... *H01L 25/0655* (2013.01); *H01L 43/02* (2013.01); *H04B 5/0031* (2013.01); *H04B 5/0075* (2013.01); *H04B 5/0093* (2013.01); *H04B 5/02* (2013.01); *H04B 17/17* (2015.01); *H04B 17/29* (2015.01); *H01L 2224/48137* (2013.01); *H04B 17/18* (2015.01)

(58) Field of Classification Search
CPC .......... H01L 2224/48137; H04B 17/29; H04B 5/0031; H04B 5/0075; H04B 5/0093
See application file for complete search history.

(56) References Cited

U.S. PATENT DOCUMENTS

| | | |
|---|---|---|
| 3,058,078 A | 10/1962 | Hoh |
| 3,537,022 A | 10/1970 | Regan |
| 3,713,148 A | 1/1973 | Cardullo et al. |

(Continued)

FOREIGN PATENT DOCUMENTS

| | | |
|---|---|---|
| DE | 10100282 | 7/2002 |
| FR | 267670 | 7/1991 |

(Continued)

OTHER PUBLICATIONS

Communication under Rule 71(3) EPC dated Nov. 20, 2018 for European Application No. 17190974.0; 7 Pages.

(Continued)

*Primary Examiner* — David Bilodeau
(74) *Attorney, Agent, or Firm* — Daly Crowley Mofford & Durkee, LLP

(57) ABSTRACT

Methods and apparatus for bi-directional communication between first and second die of a signal isolator for feedback and/or diagnostic signals. In embodiments, the first and second die can be matched.

59 Claims, 17 Drawing Sheets

(56) References Cited

U.S. PATENT DOCUMENTS

| | | |
|---|---|---|
| 3,714,540 A | 1/1973 | Galloway |
| 3,760,198 A | 9/1973 | Mori et al. |
| 3,798,608 A | 3/1974 | Huebner |
| 3,859,624 A | 1/1975 | Kriofsky et al. |
| 4,024,452 A | 5/1977 | Seidel |
| 4,027,152 A | 5/1977 | Brown et al. |
| 4,118,603 A | 10/1978 | Kumhyr |
| 4,188,927 A | 2/1980 | Harris |
| 4,227,045 A | 10/1980 | Chelcun et al. |
| 4,302,807 A | 11/1981 | Mentler |
| 4,360,784 A | 11/1982 | Bartlett |
| 4,425,647 A | 1/1984 | Collins et al. |
| 4,459,591 A | 7/1984 | Haubner et al. |
| 4,526,128 A | 7/1985 | Sorace et al. |
| 4,538,136 A | 8/1985 | Drabing |
| 4,547,961 A | 10/1985 | Bokil et al. |
| 4,650,981 A | 3/1987 | Foletta |
| 4,660,014 A | 4/1987 | Wenaas et al. |
| 4,675,579 A | 6/1987 | Hardy et al. |
| 4,703,283 A | 10/1987 | Samuels |
| 4,748,419 A | 5/1988 | Somerville |
| 4,763,075 A | 8/1988 | Weigert |
| 4,780,795 A | 10/1988 | Meinel |
| 4,785,345 A | 11/1988 | Rawls et al. |
| 4,791,326 A | 12/1988 | Vajdic et al. |
| 4,817,865 A | 4/1989 | Wray |
| 4,818,855 A | 4/1989 | Mongeon et al. |
| 4,825,450 A | 4/1989 | Herzog |
| 4,835,486 A | 5/1989 | Somerville |
| 4,853,654 A | 8/1989 | Sakurai |
| 4,859,877 A | 8/1989 | Cooperman et al. |
| 4,864,437 A | 9/1989 | Couse et al. |
| 4,868,647 A | 9/1989 | Uehara et al. |
| 4,885,582 A | 12/1989 | LaBarge et al. |
| 4,922,883 A | 5/1990 | Iwasaki |
| 4,924,210 A | 5/1990 | Matsui et al. |
| 4,931,867 A | 6/1990 | Kikuchi |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,095,357 A | 3/1992 | Andoh et al. |
| 5,102,040 A | 4/1992 | Harvey |
| 5,125,111 A | 6/1992 | Trinh |
| 5,142,432 A | 8/1992 | Schneider |
| 5,164,621 A | 11/1992 | Miyamoto |
| 5,168,863 A | 12/1992 | Kurtzer |
| 5,204,551 A | 4/1993 | Bjornholt |
| 5,270,882 A | 12/1993 | Jove et al. |
| 5,293,400 A | 3/1994 | Monod et al. |
| 5,369,666 A | 11/1994 | Folwell et al. |
| 5,384,808 A | 1/1995 | Van Brunt et al. |
| 5,396,394 A | 3/1995 | Gee |
| 5,404,545 A | 4/1995 | Melvin |
| 5,418,933 A | 5/1995 | Kimura et al. |
| 5,424,709 A | 6/1995 | Tal |
| 5,442,303 A | 8/1995 | Asada et al. |
| 5,444,740 A | 8/1995 | Mizukami et al. |
| 5,448,469 A | 9/1995 | Rilly et al. |
| 5,467,607 A | 11/1995 | Harvey |
| 5,469,098 A | 11/1995 | Johnson, Jr. |
| 5,484,012 A | 1/1996 | Hiratsuka |
| 5,533,054 A | 7/1996 | DeAndrea et al. |
| 5,539,598 A | 7/1996 | Denison et al. |
| 5,555,421 A | 9/1996 | Enzinna |
| 5,568,333 A | 10/1996 | Bang |
| 5,572,179 A | 11/1996 | Ito et al. |
| 5,588,021 A | 12/1996 | Hunt et al. |
| 5,591,996 A | 1/1997 | Haigh et al. |
| 5,596,466 A | 1/1997 | Ochi |
| 5,615,091 A | 3/1997 | Palatnik |
| 5,615,229 A | 3/1997 | Sharma et al. |
| 5,625,265 A | 4/1997 | Vlahu |
| 5,627,480 A | 5/1997 | Young et al. |
| 5,627,488 A | 5/1997 | Tanzawa et al. |
| 5,650,357 A | 7/1997 | Dobkin et al. |
| 5,654,984 A | 8/1997 | Hershbarger et al. |
| 5,663,672 A | 9/1997 | Nuechterlein |
| 5,701,037 A | 12/1997 | Weber et al. |
| 5,714,938 A | 2/1998 | Schwabl |
| 5,716,323 A | 2/1998 | Lee |
| 5,731,727 A | 3/1998 | Iwamoto et al. |
| 5,731,954 A | 3/1998 | Cheon |
| 5,774,791 A | 6/1998 | Strohallen et al. |
| 5,781,071 A | 7/1998 | Kusunoki |
| 5,781,077 A | 7/1998 | Leitch et al. |
| 5,786,763 A | 7/1998 | Canipe |
| 5,786,979 A | 7/1998 | Douglass |
| 5,801,602 A | 9/1998 | Fawal et al. |
| 5,812,597 A | 9/1998 | Graham et al. |
| 5,812,598 A | 9/1998 | Sharma et al. |
| 5,825,259 A | 10/1998 | Harpham |
| 5,831,426 A | 11/1998 | Black, Jr. et al. |
| 5,831,525 A | 11/1998 | Harvey |
| 5,844,743 A | 12/1998 | Funches |
| 5,845,190 A | 12/1998 | Bushue et al. |
| 5,850,436 A | 12/1998 | Rosen et al. |
| 5,864,607 A | 1/1999 | Rosen et al. |
| 5,900,683 A | 5/1999 | Rinehart et al. |
| 5,907,481 A | 5/1999 | Svardsjo |
| 5,913,817 A | 6/1999 | Lee |
| 5,926,358 A | 7/1999 | Dobkin et al. |
| 5,945,728 A | 8/1999 | Dobkin et al. |
| 6,049,258 A | 4/2000 | Fawal et al. |
| 6,054,780 A | 4/2000 | Haigh et al. |
| 6,061,009 A | 5/2000 | Krone et al. |
| 6,069,802 A | 5/2000 | Priegnitz |
| 6,081,112 A | 6/2000 | Carobolante et al. |
| 6,082,744 A | 7/2000 | Allinger et al. |
| 6,097,564 A | 8/2000 | Hunter |
| 6,104,003 A | 8/2000 | Jones |
| 6,124,756 A | 9/2000 | Yaklin et al. |
| 6,137,372 A | 10/2000 | Welland |
| 6,222,922 B1 | 4/2001 | Scott et al. |
| 6,232,902 B1 | 5/2001 | Wada |
| 6,249,171 B1 | 6/2001 | Yaklin et al. |
| 6,262,600 B1 | 7/2001 | Haigh et al. |
| 6,291,907 B1 | 9/2001 | Haigh et al. |
| 6,307,497 B1 | 10/2001 | Leung et al. |
| 6,384,763 B1 | 5/2002 | Leung et al. |
| 6,389,063 B1 | 5/2002 | Kanekawa et al. |
| 6,396,652 B1 | 5/2002 | Kawachi et al. |
| 6,452,519 B1 | 9/2002 | Swanson |
| 6,525,566 B2 | 2/2003 | Haigh et al. |
| 6,535,858 B1 | 3/2003 | Blaukovitsch et al. |
| 6,538,136 B1 | 3/2003 | Rizzo et al. |
| 6,603,807 B1 | 8/2003 | Yukutake et al. |
| 6,611,051 B2 | 8/2003 | Akiyama et al. |
| 6,670,861 B1 | 12/2003 | Balboni |
| 6,728,320 B1 | 4/2004 | Khasnis et al. |
| 6,747,522 B2 | 6/2004 | Pietruszynski et al. |
| 6,833,800 B1 | 12/2004 | Patterson |
| 6,873,065 B2 | 3/2005 | Haigh et al. |
| 6,902,967 B2 | 6/2005 | Beasom |
| 6,903,578 B2 | 6/2005 | Haigh et al. |
| 6,914,547 B1 | 7/2005 | Swaroop et al. |
| 6,922,080 B2 | 7/2005 | Haigh et al. |
| 6,927,662 B2 | 8/2005 | Kahlmann et al. |
| 6,940,445 B2 | 9/2005 | Kearney |
| 6,956,727 B1 | 10/2005 | Brokaw |
| 6,967,513 B1 | 11/2005 | Balboni |
| 6,977,522 B1 | 12/2005 | Murabayashi et al. |
| 7,012,388 B2 | 3/2006 | Lin et al. |
| 7,016,490 B2 | 3/2006 | Beutler et al. |
| 7,023,372 B1 | 4/2006 | Singh et al. |
| 7,053,807 B1 | 5/2006 | Gaalaas |
| 7,053,831 B2 | 5/2006 | Dempsey et al. |
| 7,064,442 B1 | 6/2006 | Lane et al. |
| 7,075,329 B2 | 7/2006 | Chen et al. |
| 7,102,388 B2 | 9/2006 | Murabayashi et al. |
| 7,110,531 B2 | 9/2006 | Prendergast et al. |
| 7,259,545 B2 | 8/2007 | Stauth et al. |
| 7,315,592 B2 | 1/2008 | Tsatsanis et al. |

(56) References Cited

U.S. PATENT DOCUMENTS

| | | | |
|---|---|---|---|
| 7,447,492 B2 | 11/2008 | Dupuis | |
| 7,709,754 B2 | 5/2010 | Doogue et al. | |
| 7,719,305 B2 | 5/2010 | Chen | |
| 7,768,083 B2 | 8/2010 | Doogue et al. | |
| 7,796,076 B2 | 9/2010 | Melanson | |
| 7,871,865 B2 | 1/2011 | Sengupta et al. | |
| 7,902,627 B2 | 3/2011 | Dong et al. | |
| 7,920,010 B2 | 4/2011 | Chen, Jr. et al. | |
| 7,923,996 B2 | 4/2011 | Doogue et al. | |
| 7,948,067 B2 | 5/2011 | Fouquet et al. | |
| 7,973,527 B2 | 7/2011 | Taylor et al. | |
| 8,063,634 B2 | 11/2011 | Sauber et al. | |
| 8,064,872 B2 | 11/2011 | Dupuis | |
| 8,138,593 B2 | 3/2012 | Pagkaliwangan et al. | |
| 8,169,108 B2 | 5/2012 | Dupuis et al. | |
| 8,447,556 B2 | 5/2013 | Friedrich et al. | |
| 8,542,010 B2 | 9/2013 | Cesaretti et al. | |
| 8,680,846 B2 | 3/2014 | Cesaretti et al. | |
| 9,741,677 B1* | 8/2017 | Strutz | H01L 24/29 |
| 9,817,078 B2 | 11/2017 | Pepka et al. | |
| 2002/0135236 A1* | 9/2002 | Haigh | H01L 23/5223 307/91 |
| 2003/0042571 A1* | 3/2003 | Chen | H01F 17/0006 257/531 |
| 2005/0185640 A1 | 8/2005 | Adam et al. | |
| 2006/0117232 A1 | 6/2006 | Warren, Jr. et al. | |
| 2007/0252247 A1* | 11/2007 | Kim | H01L 23/49503 257/666 |
| 2008/0025450 A1* | 1/2008 | Alfano | H02M 3/33523 375/362 |
| 2008/0031286 A1 | 2/2008 | Alfano et al. | |
| 2008/0267301 A1 | 10/2008 | Alfano et al. | |
| 2008/0299904 A1* | 12/2008 | Yi | H01Q 7/06 455/41.1 |
| 2010/0250820 A1 | 9/2010 | Gaalaas et al. | |
| 2010/0259909 A1* | 10/2010 | Ho | H01F 19/08 361/767 |
| 2011/0298116 A1* | 12/2011 | Mizusaki | H01L 21/561 257/676 |
| 2012/0002377 A1 | 1/2012 | French et al. | |
| 2012/0168901 A1 | 7/2012 | Santangelo et al. | |
| 2014/0266332 A1 | 9/2014 | Goswami | |
| 2014/0346887 A1 | 11/2014 | Bhamidipati et al. | |
| 2015/0004902 A1 | 1/2015 | Pigott et al. | |
| 2015/0325501 A1 | 11/2015 | Sutton et al. | |

FOREIGN PATENT DOCUMENTS

| | | |
|---|---|---|
| GB | 2173956 | 10/1986 |
| JP | S 57123460 | 7/1982 |
| JP | 744515 | 10/1991 |
| JP | 2000-174666 | 6/2000 |
| WO | WO 99/22307 | 5/1999 |
| WO | WO 03/050376 | 6/2003 |

OTHER PUBLICATIONS

Non-Final Office Action dated Dec. 12, 2018 for U.S. Appl. No. 15/702,940; 7 Pages.
Response to Non-Final Office Action dated Dec. 12, 2018 for U.S. Appl. No. 15/702,940 filed Dec. 21, 2018; 7 Pages.
Response (with Amended Claims) to European Communication dated Mar. 19, 2018 for European Application No. 17190972.4; Response filed Sep. 4, 2018; 12 Pages.
Response (with Amended Claims) to European Communication dated Mar. 19, 2018 for European Application No. 17190974.0; Response filed Sep. 3, 2018; 13 Pages.
U.S. Appl. No. 15/653,820, filed Jul. 19, 2017, Latham.
U.S. Appl. No. 15/363,285, filed Nov. 29, 2016, Milano et al.
U.S. Appl. No. 15/702,940, filed Sep. 13, 2017, Latham et al.
Jim Daughton: "Spin-Dependent Sensors", Proceedings of the IEEE, vol. 91, No. 5; May 2003; pp. 681-686; 6 Pages.
European Search Report dated Jan. 16, 2018 corresponding to European Application No. 17190972.4; 6 Pages.
European Search Report dated Jan. 15, 2018 corresponding to European Application No. 17190974.0; 6 Pages.
European Decision to Grant dated Jan. 31, 2019 for European Application No. 17190974.0; 2 Pages.
U.S. Notice of Allowance dated Mar. 18, 2019 for U.S. Appl. No. 15/702,940; 11 Pages.
European Examination Report dated Nov. 28, 2019 for European Application No. 17190972.4; 5 Pages.
Response (with Amended Claims) to European Examination Report dated Nov. 28, 2019 for European Application No. 17190972.4; Response filed Jan. 27, 2020; 10 Pages.

* cited by examiner

SIGNAL ISOLATOR HAVING BIDIRECTIONAL COMMUNICATION BETWEEN DIE

CROSS REFERENCE TO RELATED APPLICATIONS

The present application claims the benefit of U.S. Provisional Patent Application No. 62/393,805, filed on Sep. 13, 2016, which is incorporated herein by reference.

BACKGROUND

As is known in the art, signal isolators can be used to transfer information without a physical connection. For example, optocouplers can include a LED that emits light through an optically transparent insulating film (or dielectric) and strikes a photo detector that generates a current flow that corresponds to the emitted light. RF carriers can also be used to transmit information through a barrier. Data can be transferred from input to output using on/off keying (OOK) or other techniques.

SUMMARY

The present invention provides method and apparatus for a non-optical isolator that can provide bi-directional data communication between first and second dies. In embodiments, a non-optical signal isolator includes first and second dies, which may be matched, mounted on a split-paddle leadframe. In embodiments, the dies may be rotated 180 degrees from each other in order to allow for relatively direct connections between the dies. The signal isolator may comprise pairs of transmitters (TX) and receivers (RX), where each of the die contain both the drive (TX) and receive (RX) circuitry for each channel. With this arrangement, each functional channel can be set to convey signals in either direction, such as by selective wire-bonding, device programming, or the like.

In one particular embodiment, wire-bonding both the transmit and receive circuits for any given channel allows for bidirectional communication in that channel. This can be used to implement bidirectional channels for hand-shaking, error checking, etc., across the isolation barrier. For example, the receiver can communicate to the transmitter that it received a signal. In this way, the transmitter can be informed that transmitted messages have been received.

In illustrative embodiments, a signal isolator includes channels having transistor bridges on a first die driving coils on the second die, which generate a signal across a barrier that is picked up by magnetic sensors on the second die. In other embodiments, capacitive and/or inductive elements can be used to transmit and receive information across a barrier.

In one aspect, a device comprises: a first die; and a second die with a voltage barrier region between the first and second die, wherein transmit and receive paths of the first and second dies provide bi-directional communication between the first and second die for feedback and/or diagnostic signals.

The device can further include one or more of the following features: the first path includes a first transmit path comprising, in order, a first transmitter bridge, a first coil, a first voltage isolation barrier and a first magnetic sensing element and a first receive path comprising, in order, a second magnetic sensing element, a second voltage isolation barrier, a second coil, and a second transmitter bridge, the magnetic sensing element of the ordered transmit path comprises a magnetoresistive (MR) element, the magnetic sensing element of the ordered transmit path comprises a giant magnetoresistive (GMR) element, the magnetic sensing element of the ordered transmit path comprises a tunneling magnetoresistive (TMR) element, the first and second dies are substantially identical, the first and second dies are identical and rotated one-hundred and eighty degrees with respect to each other, the first and second paths are programmable to transfer information in either direction, the first die is disposed on a first leadframe portion and the second die is disposed on a second leadframe portion, wherein the first and second leadframe portions are physically separated and electrically isolated from each other, the first leadframe portion includes a dimple array on which the first die is disposed, the device comprises an IC package, the first coil is wirebonded to the first bridge, the first transmitter bridge is located on or about the first die, the first coil is located on or about the second die, and the first magnetic sensing element is located on or about the second die, the second transmitter bridge is located on or about the second die, the second coil is located on or about the first die, and the second magnetic sensing element is located on or about the first die, and/or the transmit path of the first die comprises the first transmitter bridge, and the transmit path of the second die comprises the first coil and the first magnetic sensing element.

In another aspect, device comprises: a first die; a second die; and a voltage barrier means between the first and second die; and an encoding/decoding means for providing transmit and receive paths between the first and second sets of input/output pins, wherein the transmit and receive paths of the first and second dies provide bi-directional feedback and/or diagnostic signal transfer between the first and second die.

The device can further include one or more of the following features: the first path includes a first transmit path comprising, in order, a first transmitter bridge, a first coil, a first voltage isolation barrier and a first magnetic sensing element and a first receive path comprising, in order, a second magnetic sensing element, a second voltage isolation barrier, a second coil, and a second transmitter bridge, the first magnetic sensing element of the ordered transmit path comprises a magnetoresistive (MR) element, the first and second dies are substantially identical, the first and second dies are rotated one-hundred and eighty degrees with respect to each other, and/or a leadframe including a first leadframe portion having a dimple array on which the first die is disposed.

In a further aspect, a method comprises: employing a first die; employing a second die; configuring the first and second dies for a voltage barrier region between the first and second dies; and selectively configuring the transmit and receive paths of the first and second dies to provide bi-directional feedback and/or diagnostic signal transfer between the first and second die.

The method can further include one or more of the following features: the first path includes a first transmit path comprising, in order, a first transmitter bridge, a first coil, a first voltage isolation barrier and a first magnetic sensing element and a first receive path comprising, in order, a second magnetic sensing element, a second voltage isolation barrier, a second coil, and a second transmitter bridge, the first magnetic sensing element of the ordered transmit path comprises a magnetoresistive (MR) element, the first and second dies are substantially identical, the first and second dies are rotated one-hundred and eighty degrees with respect to each other, the first transmitter bridge is located on or about the first die, the first coil is located on or about the second die, and the first magnetic sensing element is located on or about the second die, the second transmitter bridge is located on or about the second die, the second coil is located on or about the first die, and the second magnetic sensing element is located on or about the first die, and/or the transmit path of the first die comprises the first transmitter bridge, and the transmit path of the second die comprises the first coil and the first magnetic sensing element.

In a further aspect, a method comprises: employing first and second dies having a voltage barrier region between the first and second dies, and wherein transmit and receive paths of the first and second dies provide bi-directional transfer of feedback and/or diagnostic signals between the first and second die; and sending, by a transmitter on the first die, transmitter refresh signals to a receiver on the second die; sending, by the receiver, receiver refresh signals to the transmitter in response to the transmitter refresh signals; determining that the transmitter refresh signals have not been received by the receiver for a first period of time; and transitioning a receiver data valid signal after determining that the transmitter refresh signals have not been received for the first period of time.

The method can further include one or more of the following features: transitioning a transmitter data valid signal after detecting that the receiver refresh signals have not been received by the transmitter for a second period of time, the transmitter data valid signal transitions state when the transmitter has a fault, the fault comprises loss of power, the receiver data valid signal transitions state when the receiver has a fault, intervals between the transmitter refresh signals increase when the receiver refresh signals have not been detected by the transmitter for a period of time, the transmitter data valid signal transitions state when transmit refresh signals are not received by the receiver and the receiver does not send receiver refresh signals, transitioning a state of the receiver data valid signal when the transmitter refresh signals are not received by the receiver for some period of time, after a communication failure between the transmitter and the receiver, re-establishing transmission of transmitter refresh signals and receiver refresh signals, the transmitter includes a transmitter transistor bridge and a transmitter coil in the first path, the receiver includes a receiver sensing element in the first path coupled with the transmitter coil, the receiver includes a receiver transistor bridge and a receiver coil, and/or the transmitter further includes a transmitter sensing element coupled to the receiver coil.

In a further aspect, a signal isolator IC package comprises: first and second dies having a voltage barrier region between the first and second dies, and wherein transmit and receive paths of the first and second dies provide bi-directional data transfer between the first and second; and a diagnostic module configured to: send, by a transmitter on the first die, transmitter refresh signals to a receiver on the second die; send, by the receiver, receiver refresh signals to the transmitter in response to the transmitter refresh signals; determine that the transmitter refresh signals have not been received by the receiver for a first period of time; and transition a receiver data valid signal after determining that the transmitter refresh signals have not been received for the first period of time.

The IC package can further include one or more of the following features: the diagnostic module is further configured to transition a transmitter data valid signal after detecting that the receiver refresh signals have not been received by the transmitter for a second period of time, the transmitter data valid signal transitions state when the transmitter has a fault, intervals between the transmitter refresh signals increase when the receiver refresh signals have not been detected by the transmitter for a period of time, the transmitter data valid signal transitions state when transmit refresh signals are not received by the receiver and the receiver does not send receiver refresh signals, transitioning a state of the receiver data valid signal when the transmitter refresh signals are not received by the receiver for some period of time, after a communication failure between the transmitter and the receiver, re-establishing transmission of transmitter refresh signals and receiver refresh signals, the transmitter includes a transmitter transistor bridge and a transmitter coil in the first path, the receiver includes a receiver sensing element in the first path coupled with the transmitter coil, the receiver includes a receiver transistor bridge and a receiver coil, and/or the transmitter further includes a transmitter sensing element coupled to the receiver coil.

BRIEF DESCRIPTION OF THE DRAWINGS

The foregoing features of this invention, as well as the invention itself, may be more fully understood from the following description of the drawings in which.

DETAILED DESCRIPTION

Figure 1:
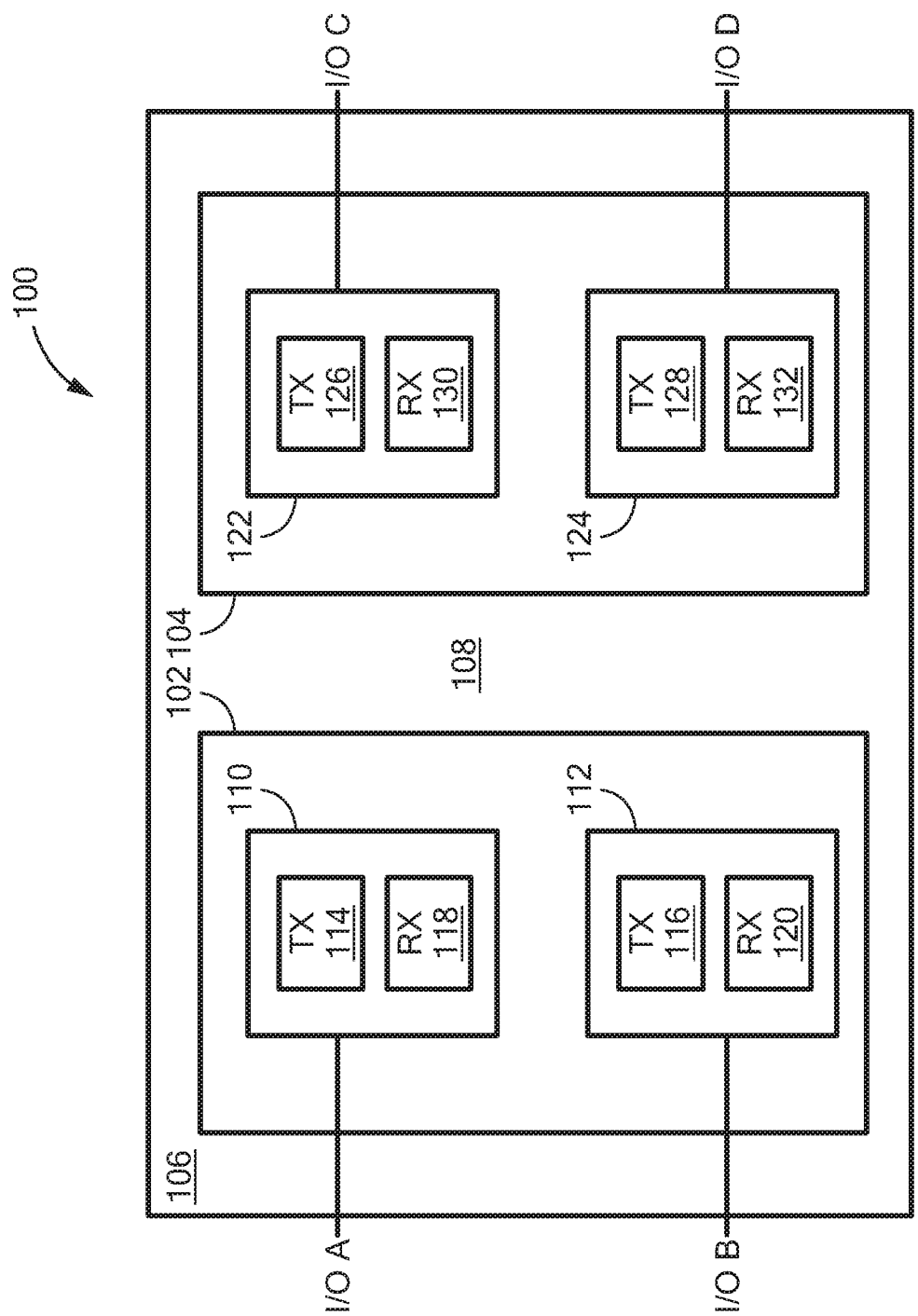
FIG. 1 is a schematic representation of a signal isolator having bidirectional data transfer in accordance with example embodiments of the invention.

FIG. 1 shows an example of a signal isolator 100 including first and second dies 102, 104 that form part of an integrated circuit package 106 providing signal isolation. In an embodiment, the IC package 106 includes a first input/output (I/O) signal I/OA and a second I/O signal I/OB connected to the first die 102. The IC package 106 further includes a third I/O signal I/OC and a fourth I/O signal I/OD connected to the second die 104. The first and second dies 102, 104 are separated by a barrier region 108, such as a high voltage barrier.

In embodiments, the first and second I/O signals I/OA,B are coupled to respective transmit/receive modules 110, 112, each of which includes a transmitter 114, 116 and a receiver 118, 120. The transmit/receive modules 110, 112 are located on, in, or about the first die 102. The third and fourth I/O signals I/OC,D are coupled to respective transmit/receive modules 122, 124, each of which includes a transmitter 126, 128 and a receiver 130, 132. The transmit/receive modules 122, 124 are located on, in, or about the second die 104.

The first transmit/receive module 110 can function as a transmitter or a receiver. Similarly, the third transmit/receive module 122 can function as a transmitter or a receiver. In embodiments, the first I/O signal I/OA can be provided as an input signal to the IC 106 and the third I/O signal I/OC can be provided as an output signal of the IC for communication in a first direction, and vice-versa for communication in the opposite direction. In this configuration, an input signal to I/OA can be received by the IC 106 and output on I/OC with isolation across the barrier region 108. In embodiments, an input signal to I/OD can be received by the IC 106 and output on I/OB and vice-versa.

It is understood that any practical number of transmit, receive, and transmit/receive modules can be formed on the first and/or second die to meet the needs of a particular application. It is further understood that transmit, receive, and transmit/receive modules can comprise the same or different components.

Figure 2:
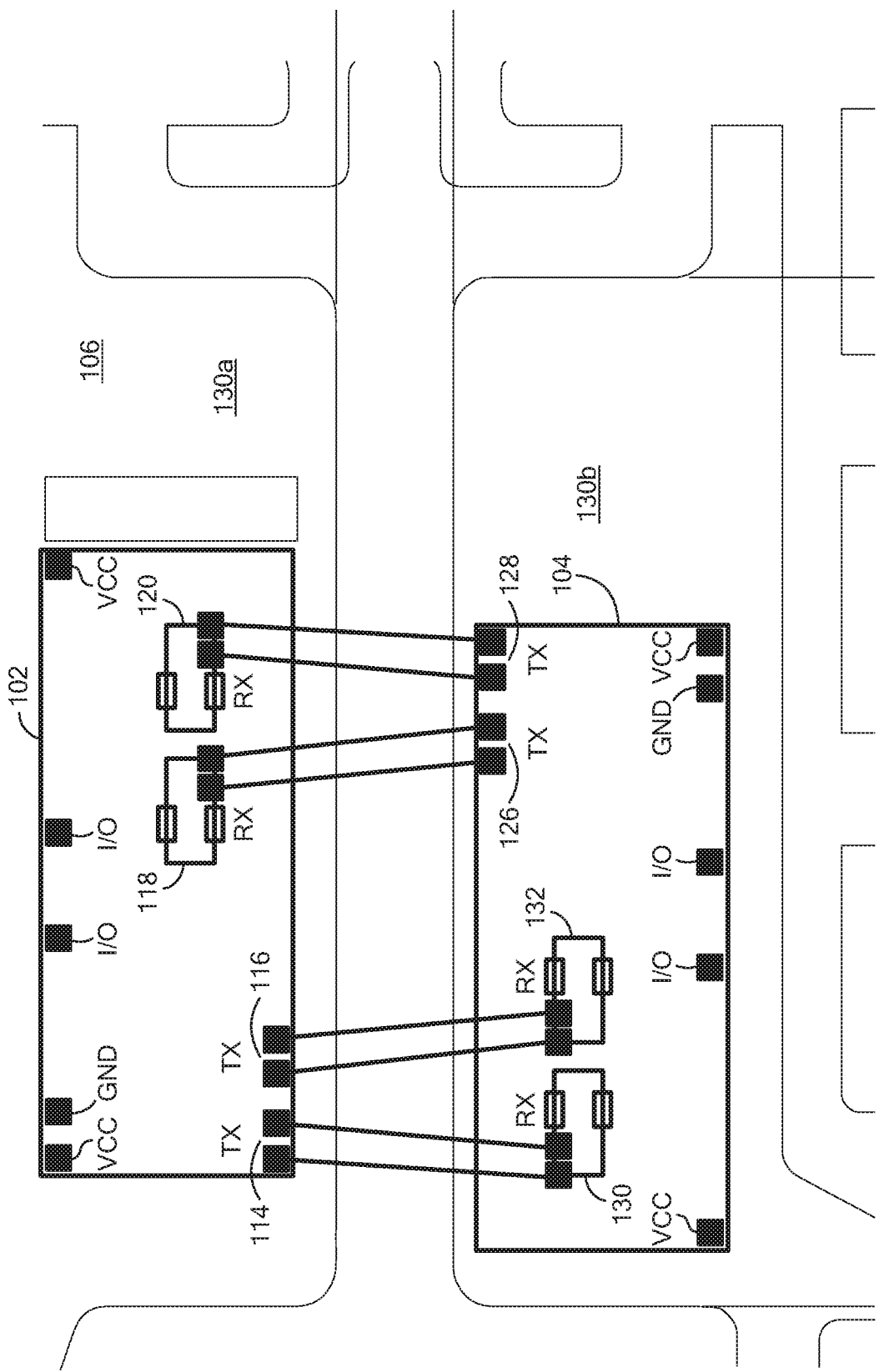
FIG. 2 is a schematic representation of the isolator of FIG. 1 having matching first and second dies.

FIG. 2 shows an example implementation of the IC 106 in which the first die 102 and the second die 104 are substantially identical and rotated 180 degrees in order to facilitate connections between the transmitters 114, 116 of the first die 102 and the receivers 130, 132 of the second die 104, as well as transmitters 126, 128 of the second die 104 and receivers 118, 120 of the first die 102. As can be seen, if the second die 104 is rotated 180 degrees, the pinout (VCC, GND I/Os, VCC) of the IC 106 and transmit and receive modules will line up so as to facilitate a series of relatively direct connections, such as wirebonds, between the first and second dies 102, 104. While the first and second die 102, 104 may be identical and rotated 180 degrees from each other, with the correct designation of transmit and receive channels, one can achieve a desired transfer of information to each die with connections nearly straight across the barrier between the dies.

In embodiments, the IC 106 can include a split die paddle in which a leadframe includes a first portion 130a on which the first die 102 is disposed and a second portion 130b on which the second die 104 is disposed. It will be appreciated that the first and second portions 130a,b of the leadframe isolates the first and second dies 102, 104. In embodiments, the first and second portions of the leadframe 130a,b are physically and electrically isolated. In embodiments, separate voltage supply signals and ground connections can be provided to each of the first and second dies 102, 104 of the IC 106 to promote isolation.

With this arrangement, digital signals can be provided as inputs to the IC 106 which can generate digital output signals that are isolated to enable systems to communicate with each other via the IC, for example. It is understood that the ground potential connections to the first and second dies can vary by hundreds of volts, for example. Isolation can be provided by capacitive, inductive, and/or coil to magnetic sensing elements for transferring information across the barrier.

Figure 3:
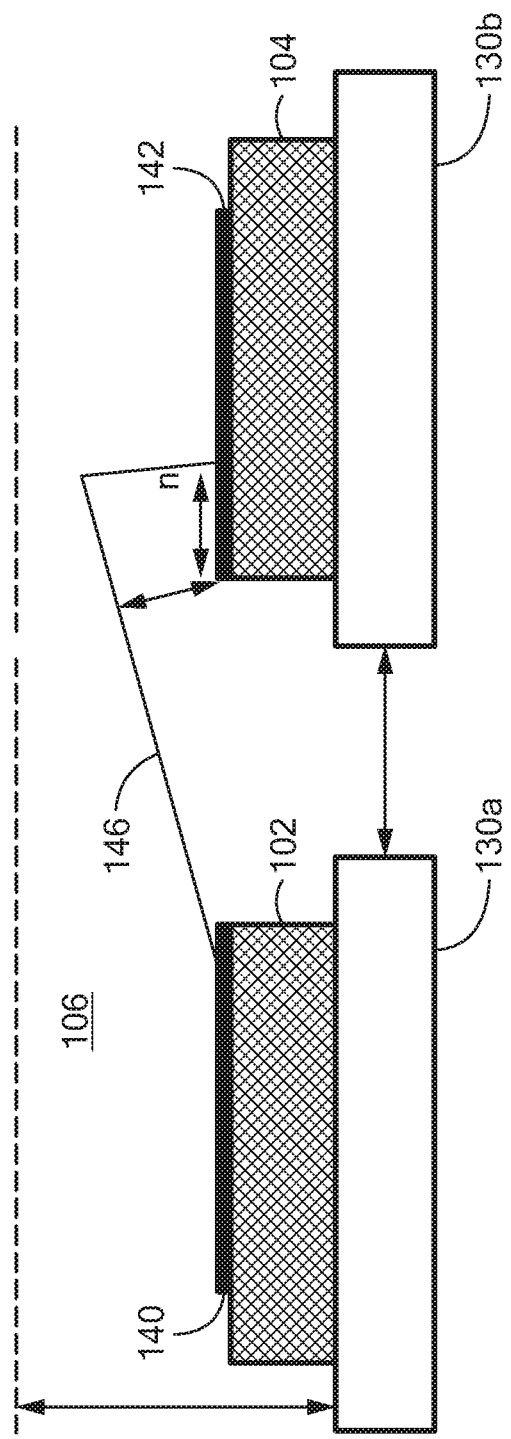
FIG. 3 is a cross-sectional side view of the isolator of FIG. 1.

FIG. 3 shows one particular implementation of an IC 106 having first and second dies 102, 104 on separate leadframe portions 130a,b. Polyimide, SiO2 or other insulating layer(s) 140, 142 for example, can be disposed on the dies 102, 104. Wirebonds 146 can connect the first and second dies 102, 104 to form the transmit/receive paths across the barrier. In embodiments, the wirebonds go up and down in opposite directions, as shown.

In embodiments, a die can be wire-bonded to terminals of a transmitter, such as a coil, which can be driven to create signals that are picked up by a sensing element, such as a GMR. In the illustrated embodiment, the left die 102 is transmitting to the right die 104. In the illustrated embodiment, the wire bond 146 is oriented to achieve a desired spacing between the wire bond and the edge of the die to mitigate breakdown from the wire-bond to the edge of the die.

Figure 4:
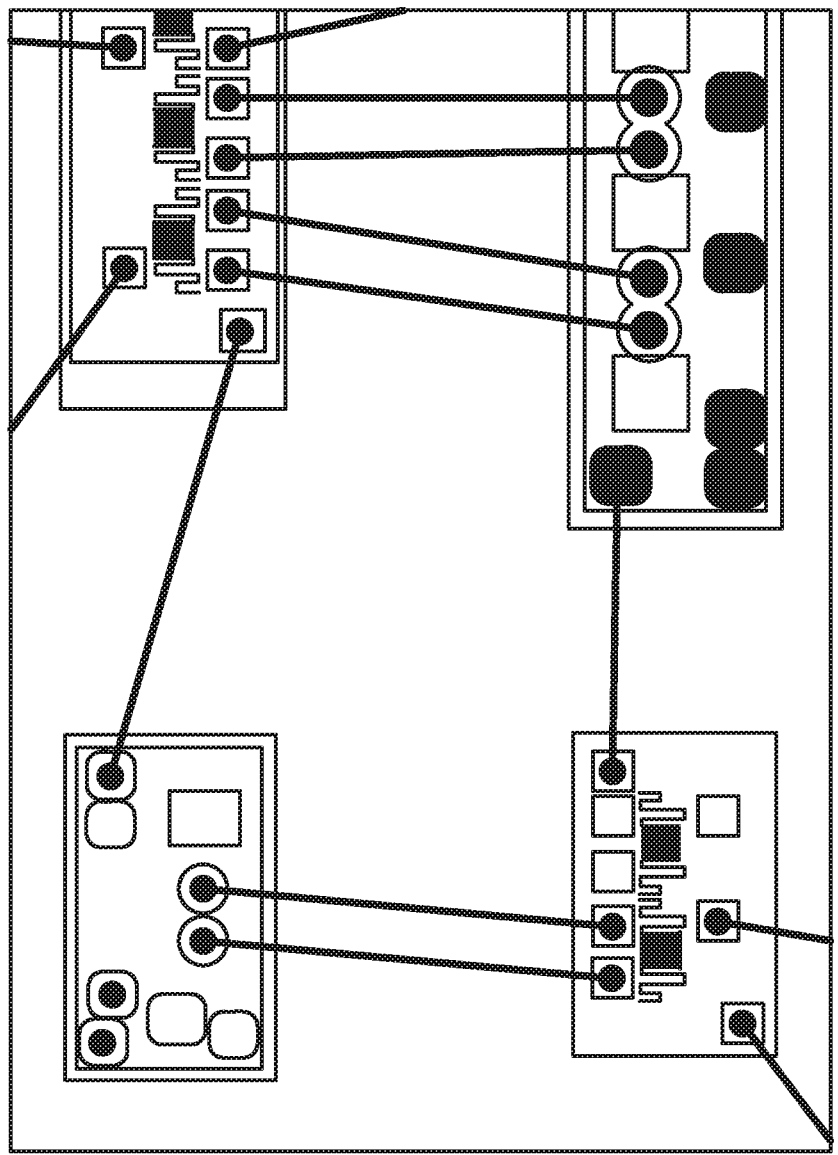
FIG. 4 is a pictorial representation of a prior art isolation having multiple dies and different dies.

In conventional isolators, dies are either a receive die or a transmit die, as shown in FIG. 4, which shows a NVE digital isolator that uses coil to GMR for isolated signal transfer. Four die are used to create a device with signals going in both directions. The top left and bottom right die are receiver dies, and the bottom left and top right are transmitter dies.

Figure 5A:
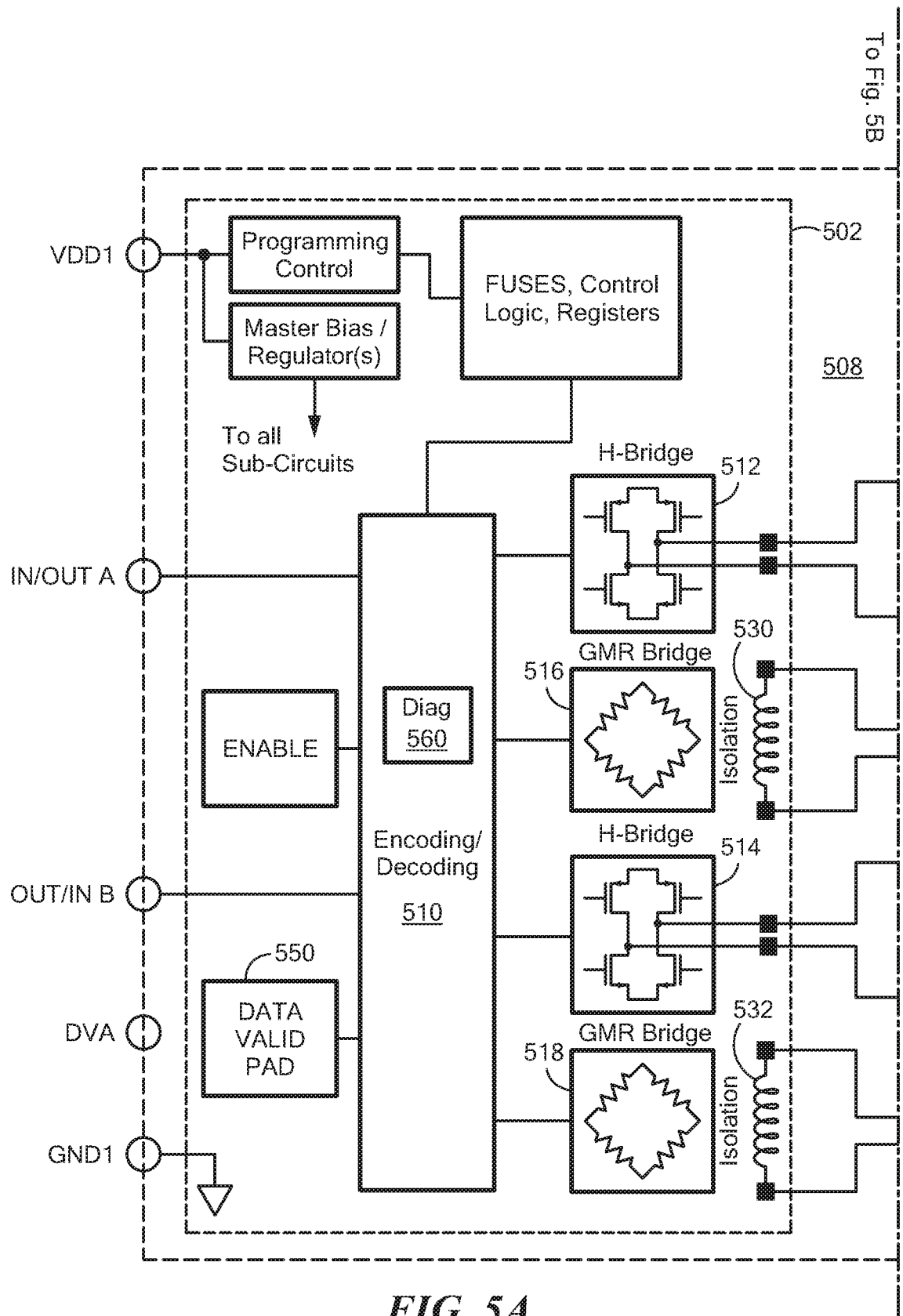
FIGS. 5A and 5B are a schematic representation of a signal isolator having a coil/GMR sensing in accordance with example embodiments of the invention.
Figure 5B:
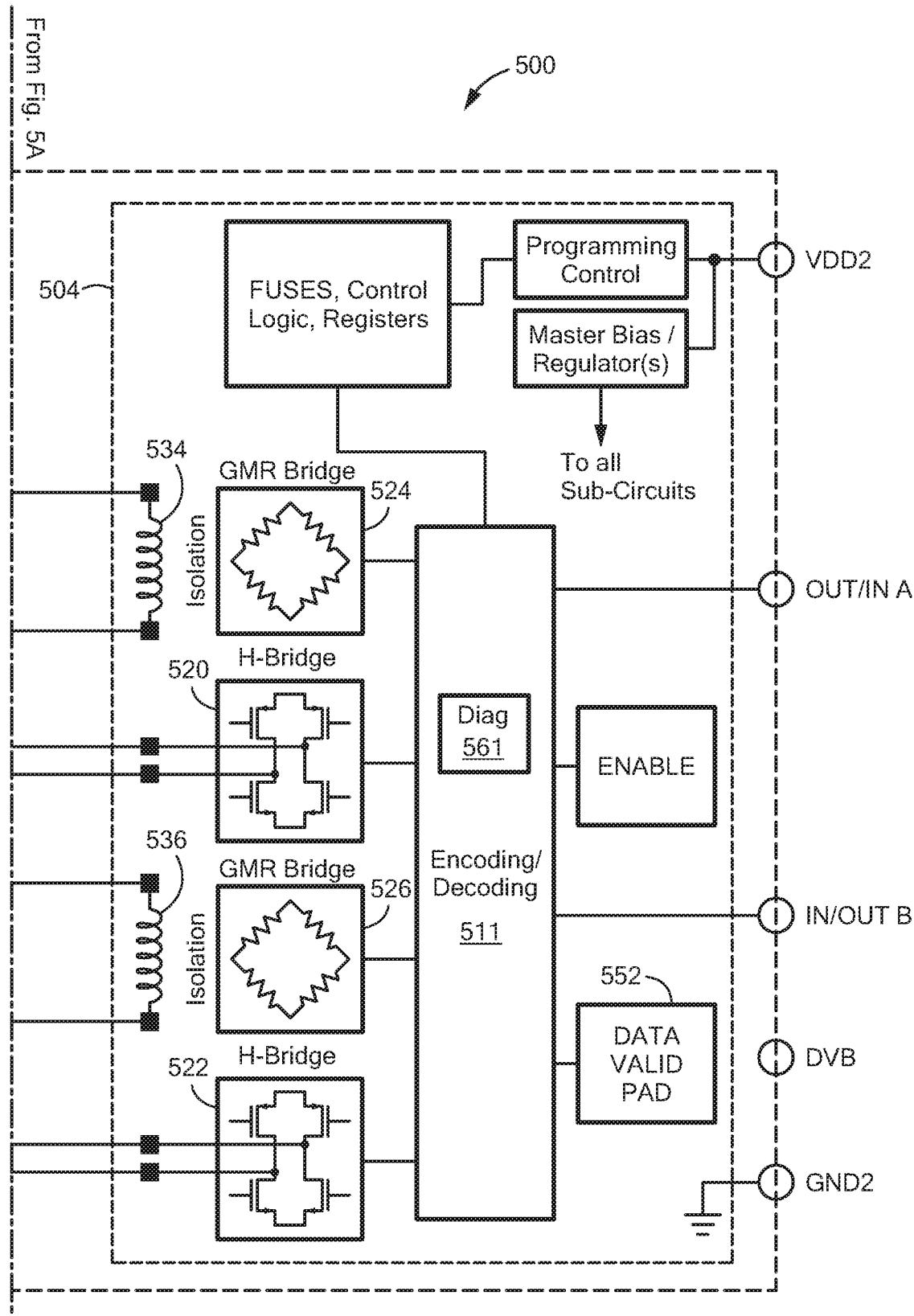

FIGS. 5A and 5B show an embodiment of an IC package 500 for a signal isolator having matched dies with transmit/receive programmability in accordance with example embodiments of the invention. A first power supply input VDD1 provides power to a first die 502 and a second power supply input VDD2 provides power to a second die 504. A first ground pin GND1 provides a ground reference for the first die 502 and a second ground pin GND2 provides a ground references for the second die 504. In embodiments, the ground pins GND1, GND2 are isolated from each other.

Signal pins include IN/OUTA and OUT/INB connected to the first die 502 and OUT/INA and IN/OUTB connected to the second die 504. In the illustrated embodiment, each of IN/OUTA OUT/INB, OUT/INA and IN/OUTB, can be programmed as an input or output signal. In embodiments, these signals may be programmed in pairs to provide a signal path through the barrier region 508 between the first and second dies 502, 504.

The first die 502 can include a first encoding/decoding module 510 coupled to signal pins include IN/OUTA and OUT/INB and the second die 504 can include a second encoding/decoding module 511 coupled to signal pins include OUT/INA and IN/OUTB. The first die 502 includes a first transmitter 512 that can be provided as a transistor bridge circuit coupled to the first encoding/decoding module 510. The first die 502 can further include a second transmitter 514. The first die includes a first receiver 516 that can be provided as a sensing element, such as a magnetic sensing element, which is shown as a GMR bridge. The first die 502 can further include a second receiver 518.

The second die 504 includes a third transmitter 520 that can be provided as a transistor bridge circuit coupled to the second encoding/decoding module 511. The second die 504 can further include a fourth transmitter 522. The second die 504 includes a third receiver 524 that can be provided as a sensing element, such as a GMR bridge. The first die can further include a fourth receiver 526.

In embodiments, the first die 502 includes a first coil 530 positioned in relation to the first GMR bridge 516 to detect signal information from the coil 530 and a second coil 532 for the second GMR bridge. The second die 504 can include coils 534, 536 for respective bridges 524, 526 on the die for detecting signals from transmitters 512, 514 on the first die 502.

In an example for the illustrated embodiment, the coil 530 is energized by the first transmitter 520 of the second die 504 and sensed by the GMR bridge 516. In one particular configuration, an input signal received on OUT/INA is received and provided to transmitter 520 in accordance with a path configuration of the second encoding/decoding module 511. The transmitter 520 energizes the coil 530 on the first die 502 for sensing by bridge 516. In accordance with path configuration data in the first encoding/decoding module 510, the sensed signal is provided to the IN/OUTA pin of the IC 500.

The first and second encoding/decoding modules 510, 511 selectively configure a path between one of IN/OUTA and OUT/INB for the first die 502 and one of OUT/INA and IN/OUTB for the second die 504. The programmability of the paths enables each of IN/OUTA, OUT/INB, OUT/INA and IN/OUTB to be an input signal or an output signal with desired signal isolation.

The first and second encoding/decoding modules 510, 511 can each include a respective diagnostic module 560, 561 for generating refresh signals, such as pulses between transmit and receive paths, as described more fully below. In embodiments, transmitter 512, coil 534, and sensing element 524, and transmitter 520, coil 530 and sensing element 516 can provide bi-directional communication between the first and second die for feedback and diagnostic signals, as described below.

Figure 6:
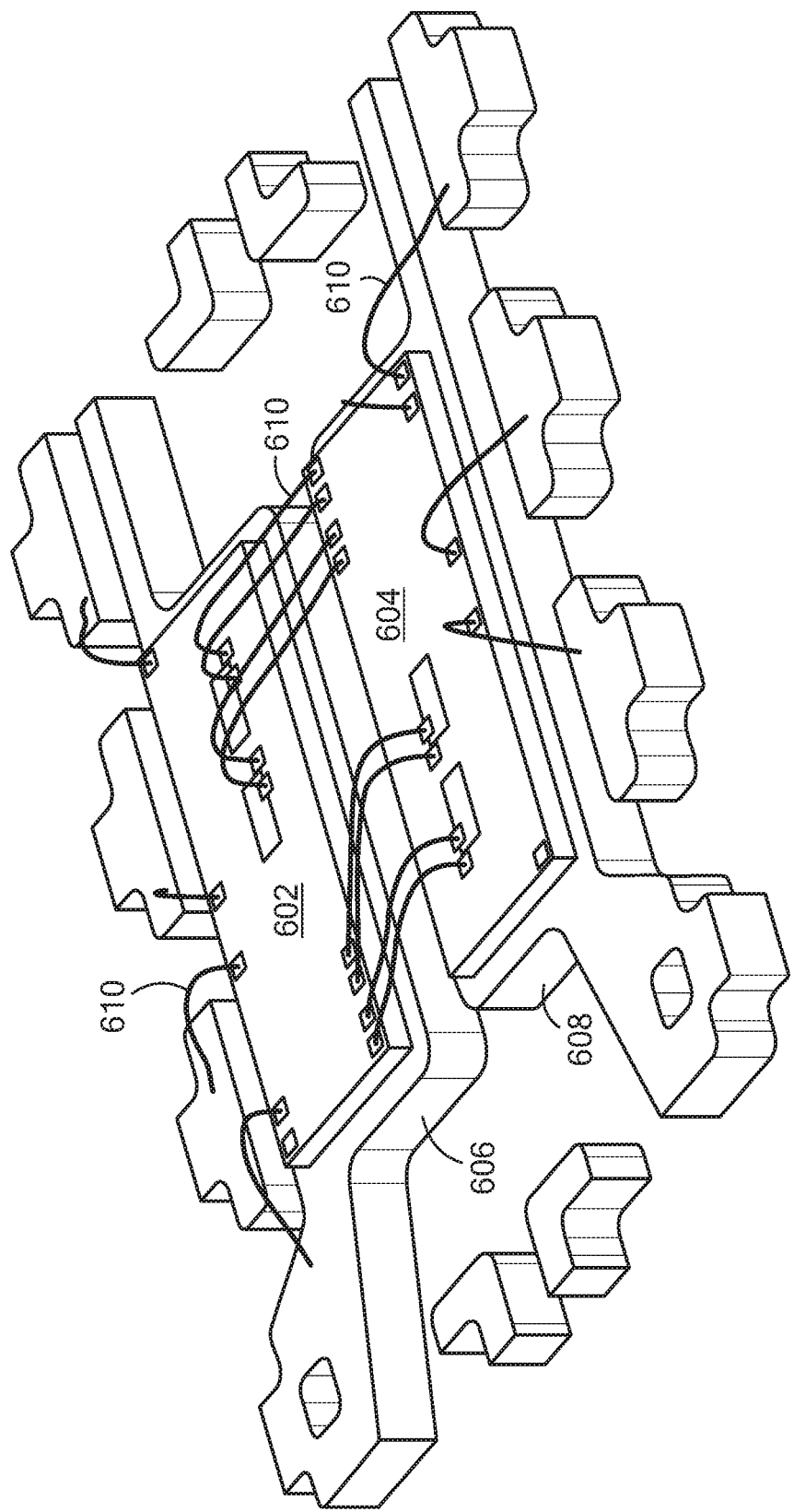
FIG. 6 is a perspective representation of a signal isolator having matching dies on a split leadframe in accordance with example embodiments of the invention.

FIG. 6 shows a schematic representation of first and second die 602, 604 on a split leadframe having isolated first and second portions 606, 608 with wirebonds 610 providing transmit/receive paths between the dies and power/ground connections. As can be seen, the first and second die 602, 604 are substantially identical and rotated 180 degrees with respect to each other to facilitate the transmitter-receiver wirebond connections between the first and second dies.

Embodiments of the invention may allow for a single die configuration to be used to provide isolated transmitter-receiver channels between first and second dies housed in a single IC package. With this arrangement, a single die design can be developed, produced, and tested to simplify and lower the cost of the process and the supply chain. In contrast to conventional isolator ICs that require multiple die designs, embodiments of the invention may utilize two substantially identical die for a bidirectional isolator IC package.

In embodiments, wire bonds can be connected across a barrier between first and second die to enable selection of a direction of each channel through programming, such as during final test. This simplifies the supply chain since all of the versions of the IC package may be the same up until final test. In alternative embodiments, directionality can be determined during assembly, for example by the wire bonds. In further embodiments, pull up/down wire-bonding can be used to program the devices instead of configuration data in non-volatile memory, for example.

It will be appreciated that bi-directionality on each channel allows for hand-shaking and error checking as data is transmitted and received. For example, a transmitter can receive information from a receiver that data is being received. It is understood that conventional isolators, such as optical isolators, do not allow for a receiver to send information to the transmitter.

Figure 6A:
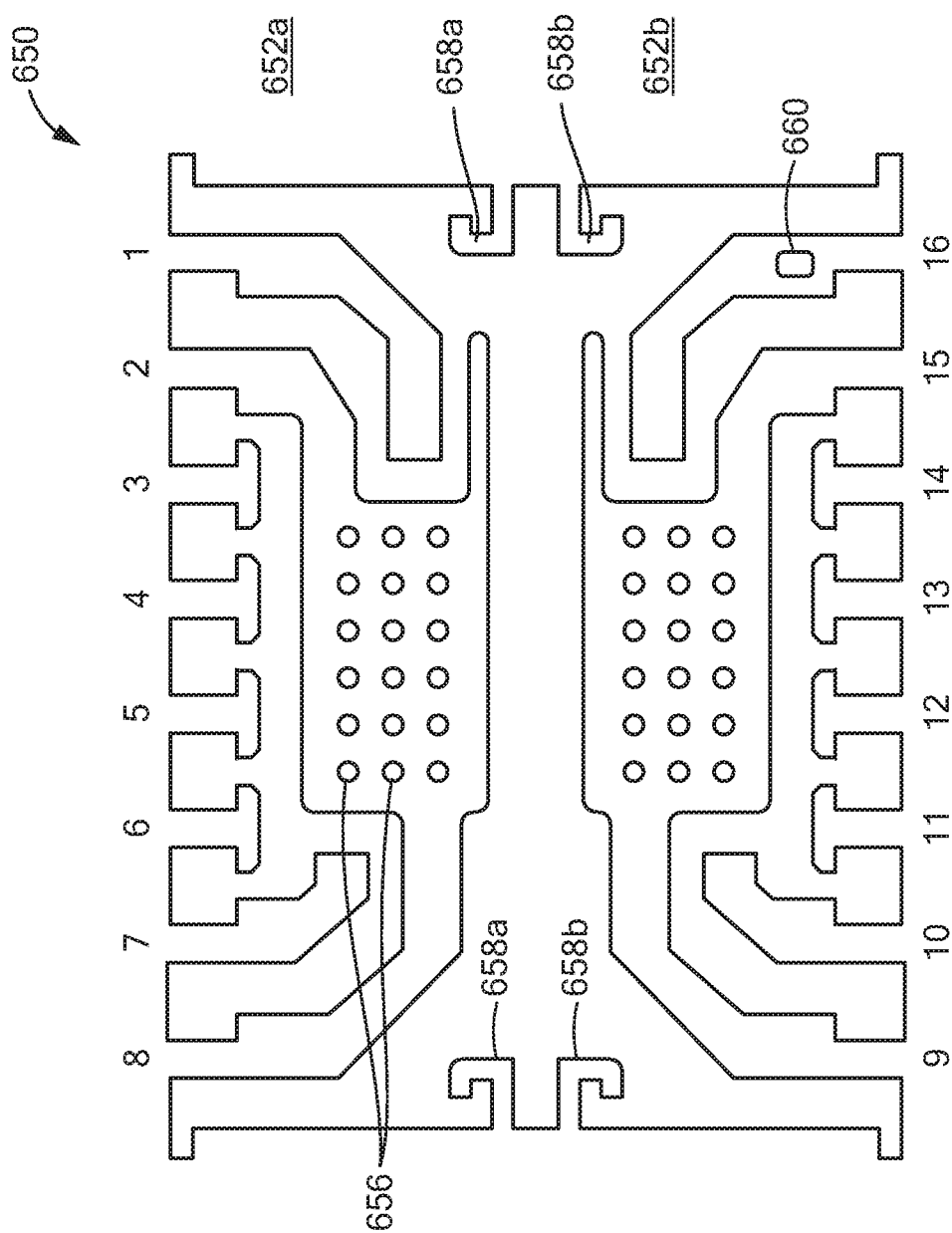
FIG. 6A is a top view of a leadframe for a signal isolator having matching dies on a split leadframe in accordance with example embodiments of the invention.
Figure 6B:
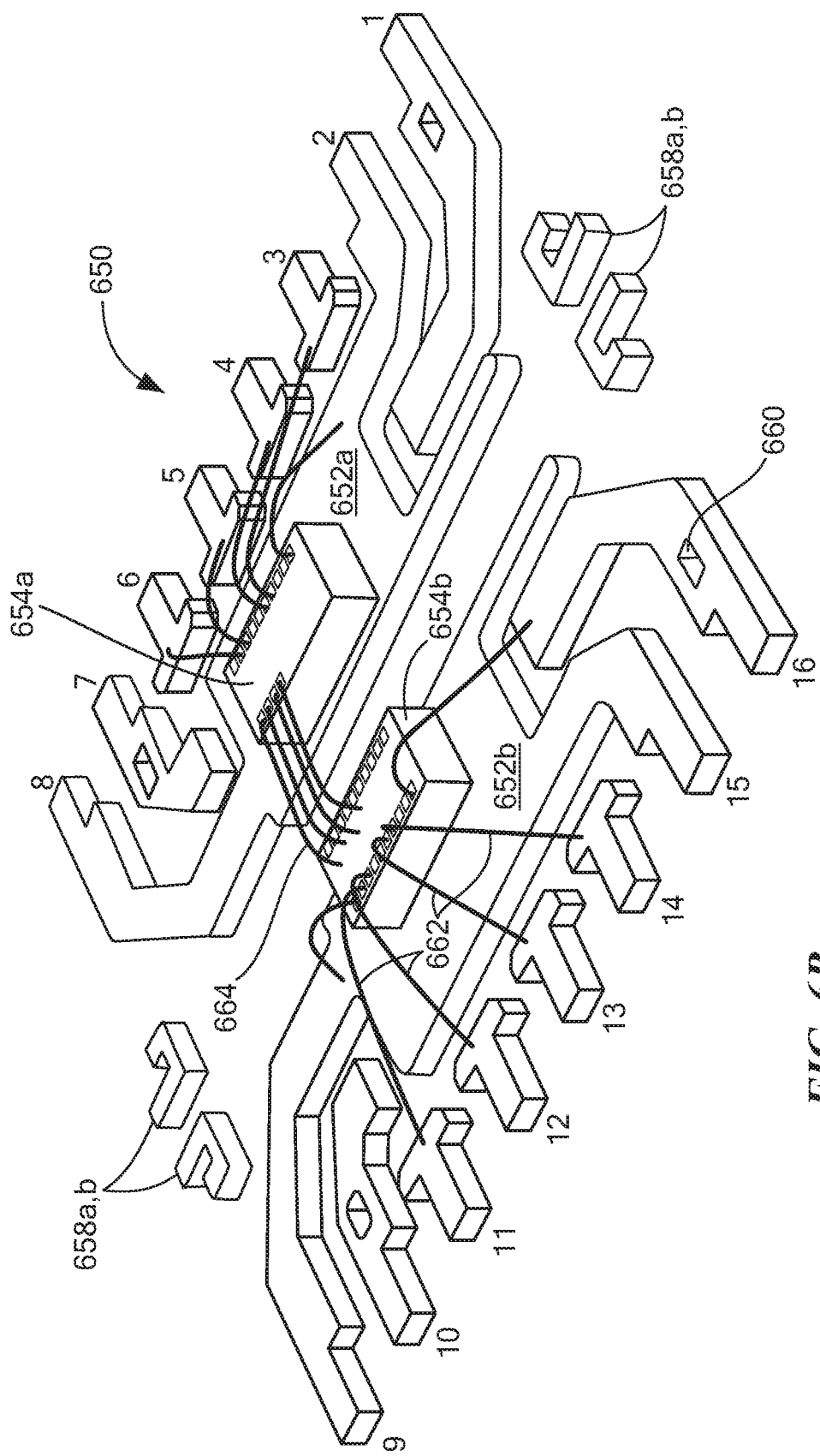
FIG. 6B shows a perspective representation of matching dies of a signal isolator on the split leadframe of FIG. 6A.

FIG. 6A shows an example split leadframe 650 having isolated first and second portions 652*a,b* and FIG. 6B shows the split leadframe 650 having matched first and dies 654*a,b* disposed on the respective first and second leadframe portions 652*a,b*. The first portion 652*a* of the leadframe can include dimples 656 in an array configuration. In the illustrated embodiment, the dimple array is a 3×6 array. It is understood that dimples 656 comprise a protrusion of some sort above the planar surface of the leadframe to mitigate delamination of the die from the leadframe. It is further understood that the array can include columns and rows of dimples, a random distribution of dimples, and/or a combination thereof.

In the illustrated embodiment, pin numbers are shown from pin 1 in the top right to pin 16 in the bottom right. In one particular embodiment, pins 2, 8, 9, and 15 are configured for connection to ground. In one embodiment, pins 2 and 8 form one ground that is different from another ground formed by pins 9 and 16

In embodiments, the leadframe portions can include respective tails 658*a, b* to enhance clamping during wire-bonding 662 to the leadframe fingers. In some embodiments, one or more anchor holes 660 can be stamped or etched in one or more pins to facilitate mold adhesion on floating leads, for example.

FIG. 6B shows connections 664 between transmitters and receivers on the respective dies 654*a,b* as shown and described above.

Figure 7:
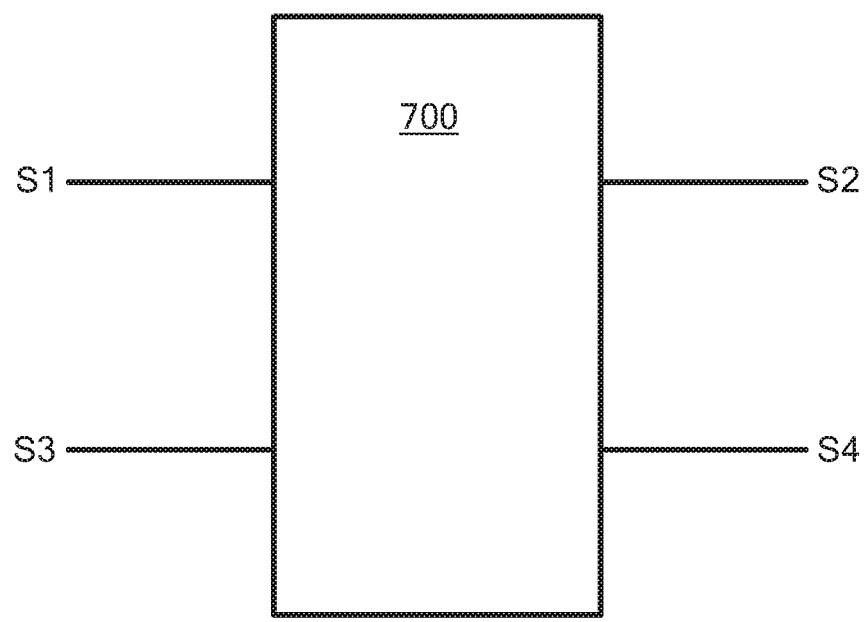
FIG. 7 is a schematic representation of a signal isolator coupled to systems that may want to communicate with each other.

FIG. 7 shows an example isolator 700 IC in accordance with illustrative embodiments coupled to first, second, third, and fourth systems S1, S2. S3, S4. The first system S1 can transmit and receive data with the second system S2 and the third system S3 can communicate with the fourth system S4. In embodiments, the first system S1 can communicate with the fourth system S4 with control of the data paths by the first and second encoding/decoding modules 510, 511 (FIG. 5). Similarly, the third system S3 can communicate with the second system S2 and/or fourth system S4. In embodiments, the second system S2 can communicate with the first and/or third systems S1, S3, and the fourth system S4 can communicate with the first and/or third systems S1, S3. In embodiments, a system can communicate with one or more systems coupled across the barrier via first and second dies.

In another aspect of the invention, a signal isolator includes diagnostic functionality to determine if signals are transferring correctly. In embodiments, an internal return communication channel on a unidirectional external communication channel can be used for implementing diagnostics to determine if signals are transferring correctly. Diagnostic results may be provided to systems coupled to the isolation IC package on each side the isolation barrier. In embodiments, an isolator IC package can include a data valid pin associated with each of the first and second dies to provide diagnostic results indicating whether data was successfully transferred over the channels. A diagnostic failure can be communicated via one of the communication channels on one or both sides of the barrier. In embodiments, a diagnostic failure can cause the signal isolator to enter a pre-determined state, such as data transmission/reception stoppage. Output(s) may enter a predetermined state or signal level or become high-impedance.

Referring again to FIG. 5, first and second data valid pads 550, 552 may be provided for the respective first and second dies 502, 504. Data valid signals can be provided as pins DVA and DVB on the IC package and controlled by the respective first and second encoding/decoding modules 510, 511, which can monitor transmit and receive signal, as described more fully below.

In embodiments, for each channel between the first and second dies, there is a driver, coil, and GMR signal path in each direction. For example, channel A (upper channel) may transfer information from left to right, such that bridge 512 to coil 534 to GMR 524 can be used for signal transfer. The path of bridge 520 to coil 530 to GMR 516 for channel A (the lower path for channel A), provides data flow in the opposite direction for enabling a receiver to indicate to the transmitter that the message was received. Similar upper and lower paths can be formed for channel B to enable bi-directional data flow.

The receiver can indicate that the message was received and/or echo the message back and/or periodically indicate that messages are being received. Through handshaking, the transmitter and receiver can both determine that communications are flowing between the first and second die. In embodiments, the status of the data flows for the upper and lower channel A is indicated with the respective data valid pins DVA, DVB. In this way, the systems on both sides of the isolation barrier are able to know whether the information they are sending is being received and/or whether information is being sent.

In example embodiments, signal edges are transmitted across the barrier between the first and second dies. When the input transitions, a pulse of current is injected in the coil in the direction of change in order to indicate this change to the receiver. For example, a high to low transition results in a negative pulse of current. In embodiments, the transmitter repeats the last transition at a fixed interval Trefresh if there is no change on the input. The receiver sends a similar refresh pulse. In example embodiments, every 1.5*Trefresh, as long as the receiver has received a pulse from the transmitter, the receiver issues a pulse to the transmitter. The receiver issues a positive pulse if its output is high and a negative pulse if its output is low.

In embodiments, receiver and transmitter refresh signals and example times and edges are monitored to determine the health of the transmit and receive paths between the die. It is understood that a wide range of signal types, characteristics, timing, durations, etc., can be used to monitors signals along the transmit and receive paths without departing from the scope of the invention.

In other embodiments, the receiver constantly reflects received pulses back to the transmitter to allow for fast checking of the communication, as well as bit by bit correctness. In the event that the receiver does not receive a pulse from the transmitter in 1.5*Trefresh, for example, the receiver may de-assert its data valid pin to indicate to the system on that side that the receiver has stopped receiving information from the transmitter. In the event that the transmitter does not see a pulse back from the receiver in 2*Trefresh, for example, the transmitter de-asserts its data valid pin, indicating to the system on that side that the information being sent is no longer being received. In embodiments, the transmitter can also slow its refresh pulses to 3*Trefresh, for example.

In embodiments, if the transmitter determines that one of its inputs is floating, the transmitter may stop transmitting pulses on that channel and de-assert its data valid pin. Similarly, if any type of built-in self-test (BIST) on either the transmitter or receiver fails, the IC may stop sending pulses across the barrier and de-assert its data valid pin.

Figure 8A:
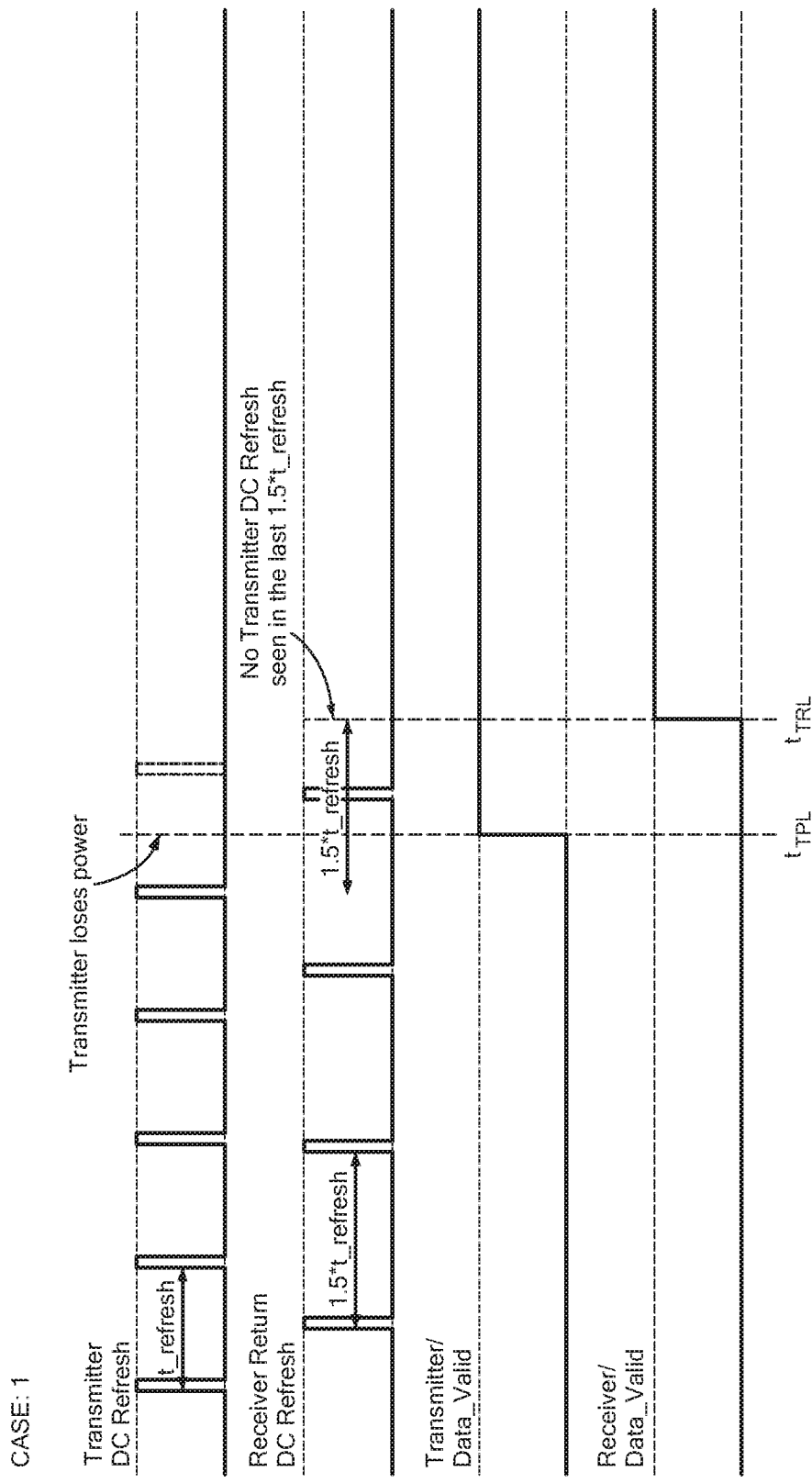
FIGS. 8A-F are example waveform diagrams showing fault detection and reporting in accordance with embodiments of the invention.

FIG. 8A shows an example waveform in which refresh pulses are generated by a transmitter with an edge at a given intervals t_refresh and receiver refresh pulses are generated at intervals of 1.5*t_refresh. A transmitter data valid signal and a receiver data valid signal are initially at a level corresponding to valid data while the data and refresh pulses are being timely transmitted.

In embodiments, a transmitter may refer to a signal source, such as bridge 512 in FIG. 5, which may include coil 534, and a receiver may refer to a sensing element, such as sensing element 524 in FIG. 5, which is coupled to coil 534. In embodiments, data may go in one direction from a transmitter to a receiver and refresh/diagnostic signals flow in both directions. In embodiments, refresh signals are transmitted by a transmitter when there is no data to be transmitted to the receiver.

At a given time $t_{TPL}$, the transmitter loses power causing the transmitter data valid signal to transition indicating that data is no longer valid. Refresh pulses cease being transmitted and nothing is transmitted to the receiver. At time $t_{TRL}$, which is 1.5*Trefresh from the last transmitter refresh pulse edge, the receiver de-asserts its data-valid pin.

Figure 8B:
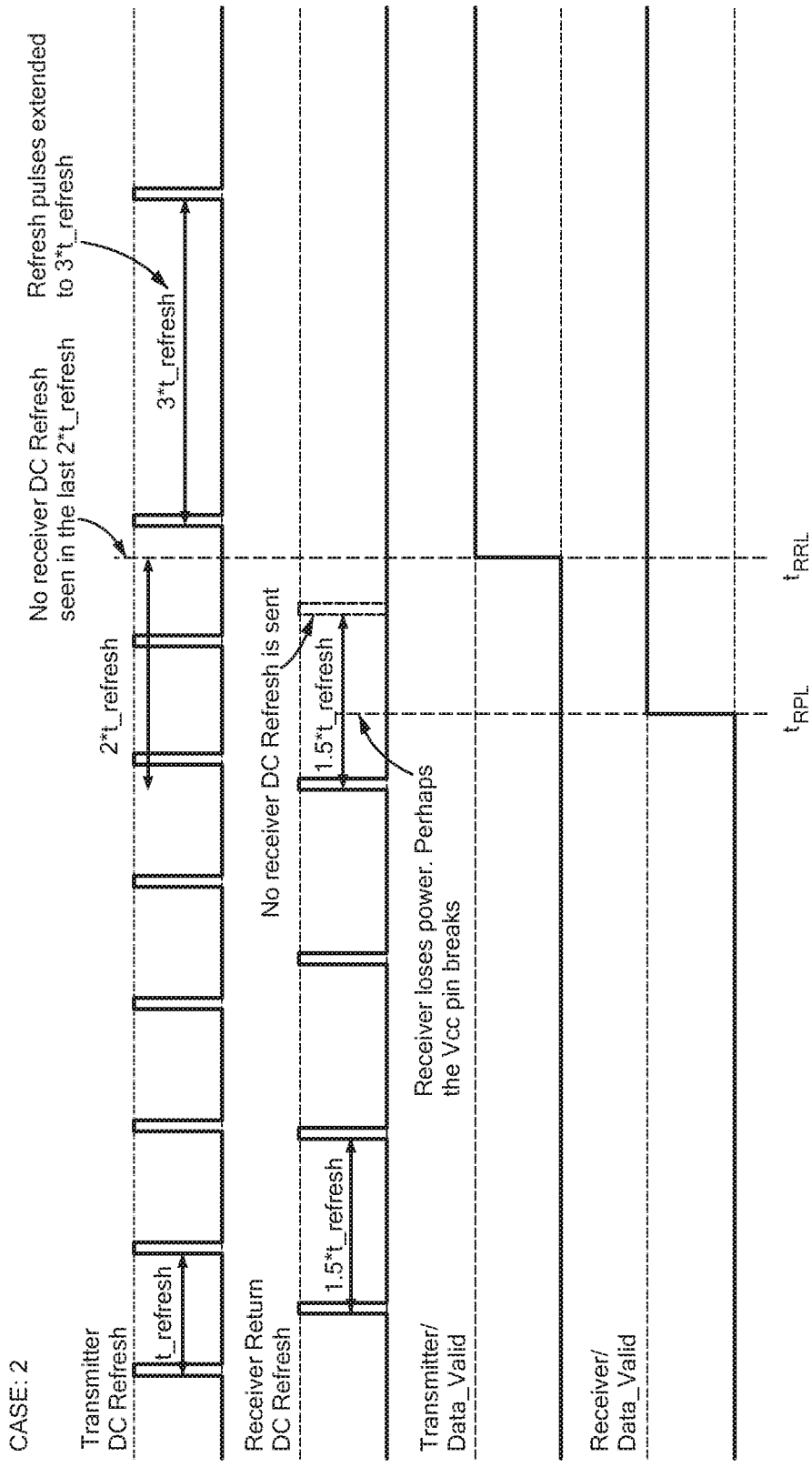

FIG. 8B shows the same signals as FIG. 8A when the receiver loses power or enable pin is logic low at time $t_{RPL}$: In this case, the transmitter will not receive any return pulses from the receiver. After time 2*Trefresh, for example, from the last receiver refresh pulse edge, the transmitter de-asserts its data-valid pin at time $t_{RRL}$. The transmitter may also slow down its refresh pulses to 3*t_refresh but continue to issue them, in order to recover in the case that the receiver regains power.

Figure 8C:
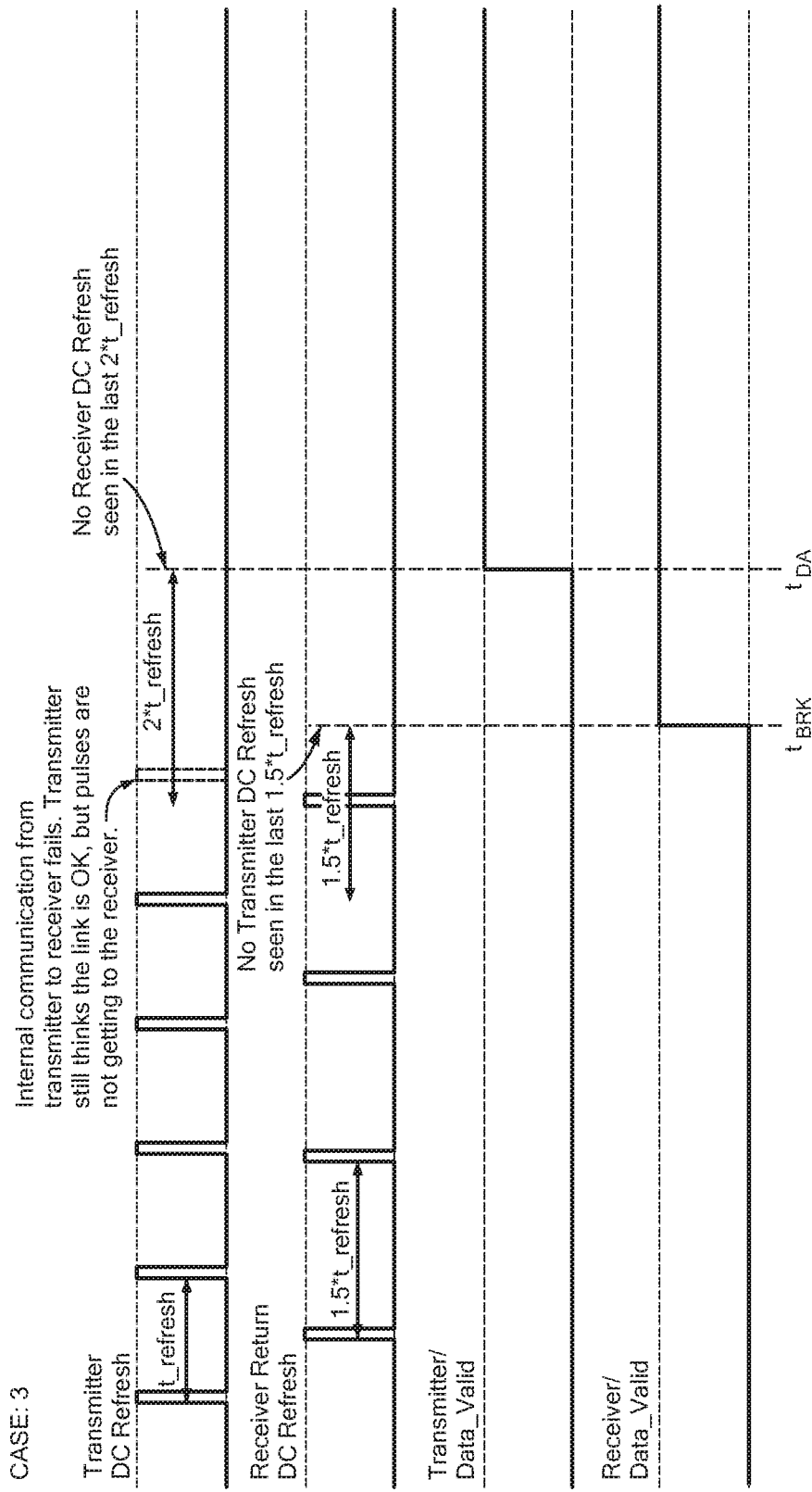

FIG. 8C shows waveforms corresponding to broken transmit/receive circuitry on the forward path (e.g., wire bond breaks, GMR breaks, etc. . . . ): The transmitter is not aware that the transmitted pulses are not being received. The receiver does not receive any information. At time $t_{BRK}$, which corresponds to 1.5*Trefresh, for example, from the last transmitter refresh pulse edge, the receiver de-asserts its data-valid pin. Also, the receiver does not send any reverse refresh pulses, so that the transmitter de-asserts its data-valid pin at time $t_{DA}$ and slows down its refresh rate. A reverse pulse may refer to a situation in which the receiver is looking for refresh pulses every Trefresh, and the transmitter is looking for refresh pulses (reverse refresh pulse) every 2*Trefresh, for example. If the transmitter does not see a reverse pulse, for example, it is determined that the receiver is having problems.

Figure 8D:
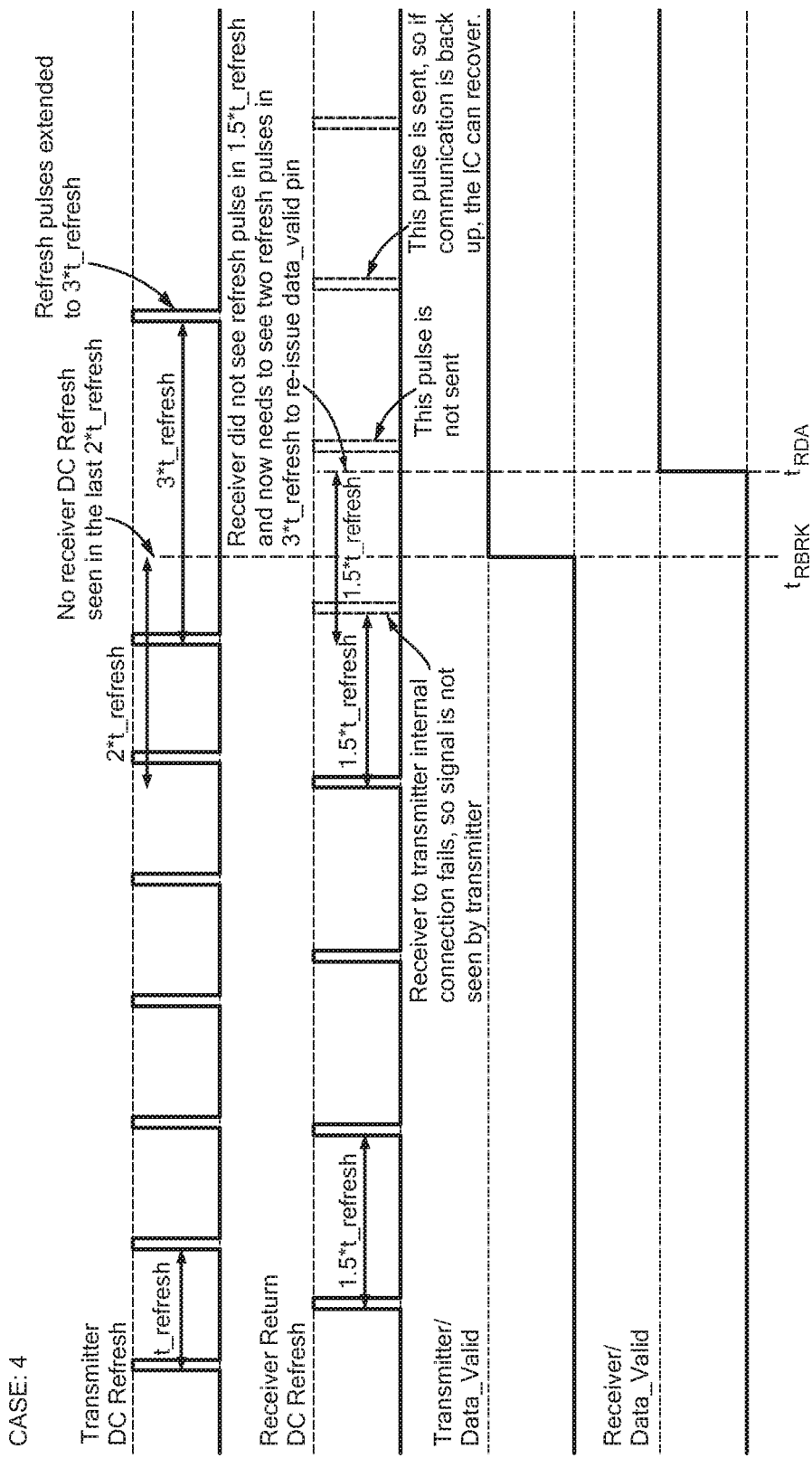

FIG. 8D shows waveforms corresponding to a break in the transmit/receive circuitry on the reverse path (e.g., wire bond breaks, GMR breaks, etc.). In this case, the receiver is receiving the correct information, but the receiver is not able to provide an indication of this to the transmitter. In this situation, the transmitter will not receive any reverse pulses, so it will de-assert its data-valid pin at time $t_{RBRK}$ and start sending pulses at 3*Trefresh, for example. In this way, the receiver will then time-out on the other side and de-assert its data-valid pin at time $t_{RDA}$.

Figure 8E:
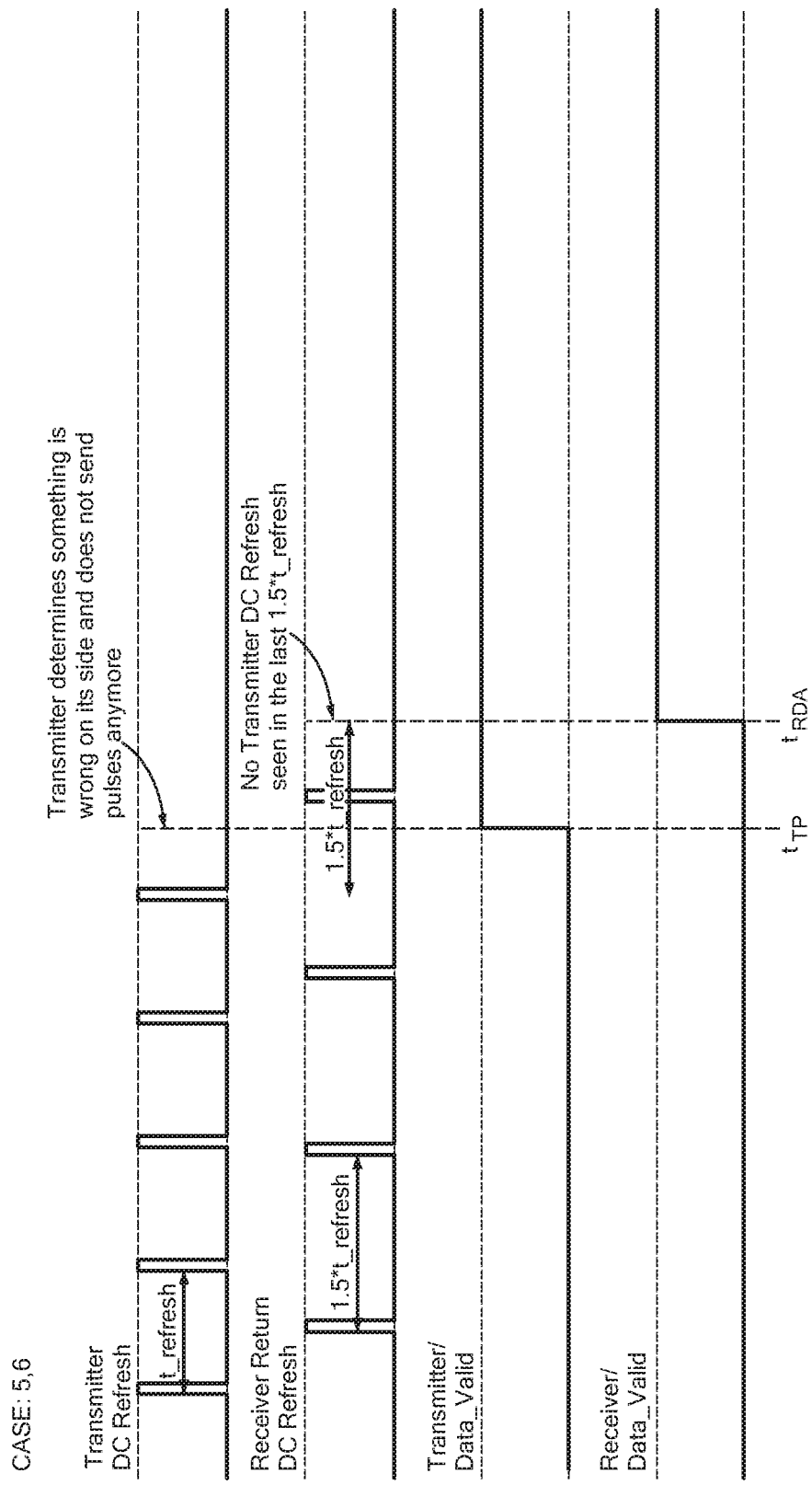

FIG. 8E shows waveforms corresponding to the transmitter input not being driven. The transmitter detects this situation at time tip, stops sending refresh pulses across the barrier, and de-asserts its data valid pin. The receiver does not see any transmitter refresh pulses and de-asserts its data valid pin at time $t_{RDA}$, which can correspond to 1.5*t_refresh from the edge of the last transmitter refresh pulse.

The waveforms can also correspond to a failure of built-in-self-test (BIST) of the transmitter. The transmitter stops sending pulses and de-asserts its data valid pin. The receiver will not see any pulses and de-asserts its data valid pin.

Figure 8F:
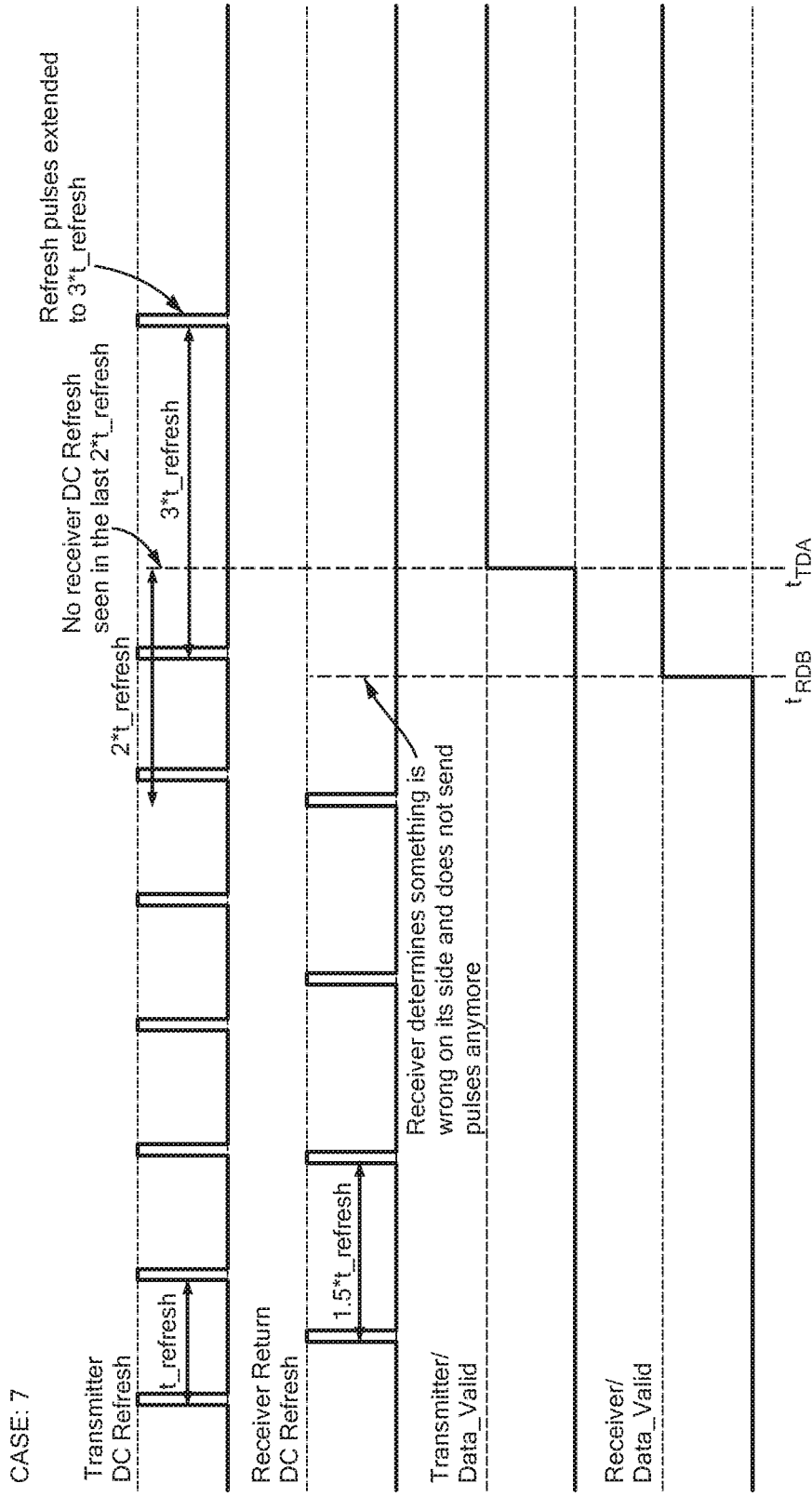

FIG. 8F shows waveforms corresponding to BIST failure on the receiver. The receiver detects a problem at time $t_{RDB}$ and stops sending refresh pulses and de-asserts its data valid pin. The transmitter stops seeing pulses in return and deassert its data valid pin at time $t_{TD4}$, which can correspond to 2*t_refresh since the edge of the last receiver refresh pulse. The transmitter may also slow down its refresh pulses until it sees a return pulse.

While embodiments of the invention are shown in described in conjunction with coil and GMR-based sensing, it is understood that other components, such as capacitor and/or inductive elements, can be used in other embodiments In addition, a variety of magnetic field sensing elements can be used.

As used herein, the term "magnetic field sensing element" is used to describe a variety of electronic elements that can sense a magnetic field. The magnetic field sensing element can comprise, but is not limited to, a Hall Effect element, a magnetoresistance element, and/or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, a magnetic tunnel junction (MTJ), and a spin-valve. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 9:
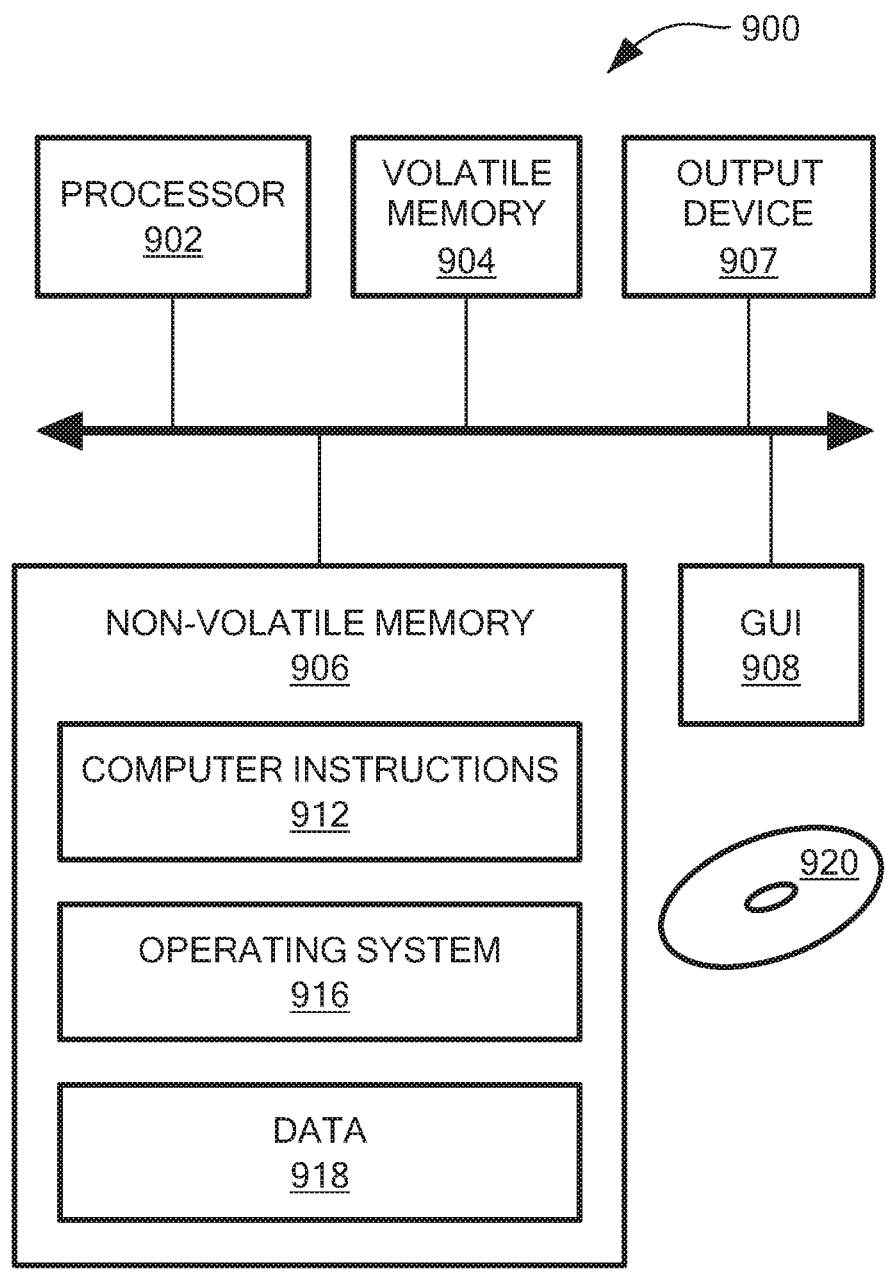
FIG. 9 is a schematic representation of an example computer that may perform at least a portion of the processing described herein.

FIG. 9 shows an exemplary computer 900 that can perform at least part of the processing described herein. The computer 900 includes a processor 902, a volatile memory 904, a non-volatile memory 906 (e.g., hard disk), an output device 907 and a graphical user interface (GUI) 908 (e.g., a mouse, a keyboard, a display, for example). The non-volatile memory 906 stores computer instructions 912, an operating system 916 and data 918. In one example, the computer instructions 912 are executed by the processor 902 out of volatile memory 904. In one embodiment, an article 920 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination.

What is claimed is:

1. A device, comprising:
   a first die; and
   a second die with a voltage barrier region between the first and second die, wherein transmit and receive paths of the first and second dies provide data transfer and bi-directional communication between the first and second die for feedback and/or diagnostic signals, wherein the first and second dies are substantially identical and rotated one-hundred and eighty degrees with respect to each other, wherein the transmit path comprises, in order, a first transmitter bridge, a first coil, a first voltage isolation barrier and a first magnetic sensing element and the receive path comprising, in order, a second magnetic sensing element, a second voltage isolation barrier, a second coil, and a second transmitter bridge.

2. The device according to claim 1, wherein the first transmitter bridge is located on or about the first die, the first coil is located on or about the second die, and the first magnetic sensing element is located on or about the second die.

3. The device according to claim 1, wherein the magnetic sensing element of the ordered transmit path comprises a magnetoresistive (MR) element.

4. The device according to claim 1, wherein the magnetic sensing element of the ordered transmit path comprises a giant magnetoresistive (GMR) element.

5. The device according to claim 1, wherein the magnetic sensing element of the ordered transmit path comprises a tunneling magnetoresistive (TMR) element.

6. The device according to claim 1, wherein the transmit and receive paths are programmable to transfer information in either direction.

7. The device according to claim 1, wherein the first die is disposed on a first leadframe portion and the second die is disposed on a second leadframe portion, wherein the first and second leadframe portions are physically separated and electrically isolated from each other.

8. The device according to claim 7, wherein the first leadframe portion includes a dimple array on which the first die is disposed.

9. The device according to claim 1, wherein the device comprises an IC package.

10. The device according to claim 1, wherein the first coil is wirebonded to the first bridge.

11. The device according to claim 10, wherein the second transmitter bridge is located on or about the second die, the second coil is located on or about the first die, and the second magnetic sensing element is located on or about the first die.

12. The device according to claim 10, wherein the transmit path of the first die comprises the first transmitter bridge, and the transmit path of the second die comprises the first coil and the first magnetic sensing element.

13. The device according to claim 1, further including a split die paddle in which a leadframe includes a first portion on which the first die is disposed and a second portion on which the second die is disposed.

14. A device comprising:
a first die;
a second die; and
a voltage barrier means between the first and second die; and
an encoding/decoding means for providing transmit and receive paths between the first and second sets of input/output pins, wherein the transmit and receive paths of the first and second dies provide data transfer and bi-directional feedback and/or diagnostic signal transfer between the first and second die, wherein the first and second dies are substantially identical and rotated one-hundred and eighty degrees with respect to each other, wherein the transmit path comprises, in order, a first transmitter bridge, a first coil, a first voltage isolation barrier and a first magnetic sensing element and the receive path comprises, in order, a second magnetic sensing element, a second voltage isolation barrier, a second coil, and a second transmitter bridge.

15. The device according to claim 14, wherein the first magnetic sensing element of the ordered transmit path comprises a magnetoresistive (MR) element.

16. The device according to claim 14, further including a leadframe including a first leadframe portion having a dimple array on which the first die is disposed.

17. The device according to claim 14, further including a split die paddle in which a leadframe includes a first portion on which the first die is disposed and a second portion on which the second die is disposed.

18. A method, comprising:
employing a first die;
employing a second die;
configuring the first and second dies for a voltage barrier region between the first and second dies; and
selectively configuring transmit and receive paths of the first and second dies to provide data transfer and bi-directional feedback and/or diagnostic signal transfer between the first and second die, wherein the first and second dies are substantially identical and rotated one-hundred and eighty degrees with respect to each other, wherein the transmit path comprises, in order, a first transmitter bridge, a first coil, a first voltage isolation barrier and a first magnetic sensing element and the receive path comprises, in order, a second magnetic sensing element, a second voltage isolation barrier, a second coil, and a second transmitter bridge.

19. The method according to claim 18, wherein the first magnetic sensing element of the ordered transmit path comprises a magnetoresistive (MR) element.

20. The method according to claim 18, wherein the first transmitter bridge is located on or about the first die, the first coil is located on or about the second die, and the first magnetic sensing element is located on or about the second die.

21. The method according to claim 20, wherein the second transmitter bridge is located on or about the second die, the second coil is located on or about the first die, and the second magnetic sensing element is located on or about the first die.

22. The method according to claim 18, wherein the transmit path of the first die comprises the first transmitter bridge, and the transmit path of the second die comprises the first coil and the first magnetic sensing element.

23. The method according to claim 18, further including employing a split die paddle in which a leadframe includes a first portion on which the first die is disposed and a second portion on which the second die is disposed.

24. A device, comprising:
a first die; and
a second die with a voltage barrier region between the first and second die, wherein transmit and receive paths of the first and second dies provide data transfer and bi-directional communication between the first and second die for feedback and/or diagnostic signals, wherein the transmit path comprises, in order, a first transmitter bridge, a first coil, a first voltage isolation barrier and a first magnetic sensing element and the receive path comprises, in order, a second magnetic sensing element, a second voltage isolation barrier, a second coil, and a second transmitter bridge, and wherein the first die includes the first transmitter bridge, the second die includes the first coil, and the second die includes the first magnetic sensing element.

25. The device according to claim 24, wherein the first and second dies are substantially identical and rotated one-hundred and eighty degrees with respect to each other.

26. The device according to claim 24, wherein the first magnetic sensing element of the ordered transmit path comprises a magnetoresistive (MR) element.

27. The device according to claim 24, wherein the first magnetic sensing element of the ordered transmit path comprises a giant magnetoresistive (GMR) element.

28. The device according to claim 24, wherein the first magnetic sensing element of the ordered transmit path comprises a tunneling magnetoresistive (TMR) element.

29. The device according to claim 24, wherein the transmit path and the receive path are programmable to transfer information in either direction.

30. The device according to claim 24, wherein the first die is disposed on a first leadframe portion and the second die is disposed on a second leadframe portion, wherein the first and second leadframe portions are physically separated and electrically isolated from each other.

31. The device according to claim 30, wherein the first leadframe portion includes a dimple array on which the first die is disposed.

32. The device according to claim 24, wherein the device comprises an IC package.

33. The device according to claim 24, wherein the first coil is wirebonded to the first die.

34. The device according to claim 24, wherein the first transmitter bridge is located on or about the first die, the first coil is located on or about the second die, and the first magnetic sensing element is located on or about the second die.

35. The device according to claim 24, wherein the second transmitter bridge is located on or about the second die, the second coil is located on or about the first die, and the second magnetic sensing element is located on or about the first die.

36. A device comprising:
a first die;
a second die; and
a voltage barrier means between the first and second die; and
an encoding/decoding means for providing transmit and receive paths between the first and second sets of input/output pins, wherein the transmit and receive paths of the first and second dies provide data transfer and bi-directional feedback and/or diagnostic signal transfer between the first and second die,.
wherein the transmit path comprises, in order, a first transmitter bridge, a first coil, a first voltage isolation barrier and a first magnetic sensing element and the receive path comprises, in order, a second magnetic sensing element, a second voltage isolation barrier, a second coil, and a second transmitter bridge, and
wherein the first die includes the first transmitter bridge, the second die includes the first coil, and the second die includes the first magnetic sensing element.

37. The device according to claim 36, wherein the first and second dies are substantially identical and rotated one-hundred and eighty degrees with respect to each other.

38. The device according to claim 36, wherein the first magnetic sensing element of the ordered transmit path comprises a magnetoresistive (MR) element.

39. The device according to claim 36, wherein the first magnetic sensing element of the ordered transmit path comprises a giant magnetoresistive (GMR) element.

40. The device according to claim 36, wherein the first magnetic sensing element of the ordered transmit path comprises a tunneling magnetoresistive (TMR) element.

41. The device according to claim 36, wherein the transmit path and the receive path are programmable to transfer information in either direction.

42. The device according to claim 36, wherein the first die is disposed on a first leadframe portion and the second die is disposed on a second leadframe portion, wherein the first and second leadframe portions are physically separated and electrically isolated from each other.

43. The device according to claim 42, wherein the first leadframe portion includes a dimple array on which the first die is disposed.

44. The device according to claim 36, wherein the device comprises an IC package.

45. The device according to claim 36, wherein the first coil is wirebonded to the first die.

46. The device according to claim 36, wherein the first transmitter bridge is located on or about the first die, the first coil is located on or about the second die, and the first magnetic sensing element is located on or about the second die.

47. The device according to claim 36, wherein the second transmitter bridge is located on or about the second die, the second coil is located on or about the first die, and the second magnetic sensing element is located on or about the first die.

48. A method, comprising:
employing a first die;
employing a second die;
configuring the first and second dies for a voltage barrier region between the first and second dies; and
selectively configuring the transmit and receive paths of the first and second dies to provide data transfer and bi-directional feedback and/or diagnostic signal transfer between the first and second die,
wherein the transmit path comprises, in order, a first transmitter bridge, a first coil, a first voltage isolation barrier and a first magnetic sensing element and the receive path comprises, in order, a second magnetic sensing element, a second voltage isolation barrier, a second coil, and a second transmitter bridge, and
wherein the first die includes the first transmitter bridge, the second die includes the first coil, and the second die includes the first magnetic sensing element.

49. The method according to claim 48, wherein the first and second dies are substantially identical and rotated one-hundred and eighty degrees with respect to each other.

50. The method according to claim 48, wherein the first magnetic sensing element of the ordered transmit path comprises a magnetoresistive (MR) element.

51. The method according to claim 48, wherein the first magnetic sensing element of the ordered transmit path comprises a giant magnetoresistive (GMR) element.

52. The method according to claim 48, wherein the first magnetic sensing element of the ordered transmit path comprises a tunneling magnetoresistive (TMR) element.

53. The method according to claim 48, wherein the transmit path and the receive path are programmable to transfer information in either direction.

54. The method according to claim 48, wherein the first die is disposed on a first leadframe portion and the second die is disposed on a second leadframe portion, wherein the first and second leadframe portions are physically separated and electrically isolated from each other.

55. The method according to claim 54, wherein the first leadframe portion includes a dimple array on which the first die is disposed.

56. The method according to claim 48, wherein the device comprises an IC package.

57. The method according to claim 48, wherein the first coil is wirebonded to the first die.

58. The method according to claim 48, wherein the first transmitter bridge is located on or about the first die, the first coil is located on or about the second die, and the first magnetic sensing element is located on or about the second die.

59. The method according to claim 48, wherein the second transmitter bridge is located on or about the second die, the second coil is located on or about the first die, and the second magnetic sensing element is located on or about the first die.

\* \* \* \* \*